United States Patent [19]
Balsells

[11] Patent Number: 5,091,606
[45] Date of Patent: Feb. 25, 1992

[54] GASKET FOR SEALING ELECTROMAGNETIC WAVES FILLED WITH A CONDUCTIVE MATERIAL

[75] Inventor: Peter J. Balsells, P.O. Box 15092, Santa Ana, Calif. 92705

[73] Assignees: Peter J. Balsells; Joan C. Balsells, both of Santa Ana, Calif.

[21] Appl. No.: 653,250

[22] Filed: Feb. 11, 1991

Related U.S. Application Data

[63] Continuation-in-part of Ser. No. 572,242, Aug. 27, 1990, which is a continuation-in-part of Ser. No. 496,329, Mar. 20, 1990, and a continuation-in-part of Ser. No. 568,909, Aug. 17, 1990, which is a continuation-in-part of Ser. No. 444,287, Dec. 1, 1989, and Ser. No. 463,480, Jan. 11, 1990.

[51] Int. Cl.⁵ .............................................. H05K 9/00
[52] U.S. Cl. ................................ 174/35 GC; 174/35 R; 267/167
[58] Field of Search .......... 174/35 GC, 35 R, 35 MS; 361/424; 277/227, 235 R, 235 B, 901; 219/10.55 R, 10.55 D; 267/167

[56] References Cited

U.S. PATENT DOCUMENTS 4,934,666  6/1990  Balsells ................................ 267/1.5

FOREIGN PATENT DOCUMENTS 0774419  5/1957  United Kingdom .......... 174/35 GC

Primary Examiner—Leo P. Picard
Assistant Examiner—Bot Lee Ledynh
Attorney, Agent, or Firm—Walter A. Hackler

[57] ABSTRACT

An electromagnetic shielding gasket assembly includes a coil spring for blocking the propagation of electromagnetic waves therepast, with the coil spring including a plurality of individual coils canted along a center line thereof. The plurality of individual coils are supported in an orientation for controlling the electromagnetic shielding effectiveness of the coil spring, and a formable conductive material, disposed on said plurality of individual coils, is provided for being formed by the plurality of coils upon loading thereof. The formed conductive material fills an aperture of the coil spring to further block the propagation of electromagnetic waves.

33 Claims, 14 Drawing Sheets

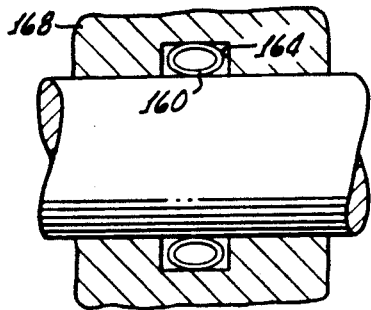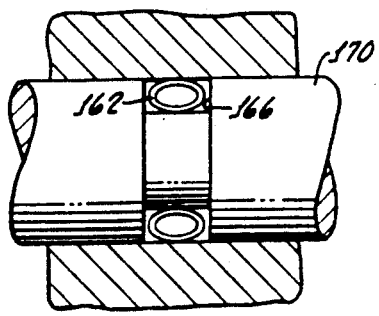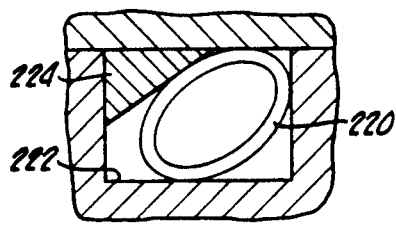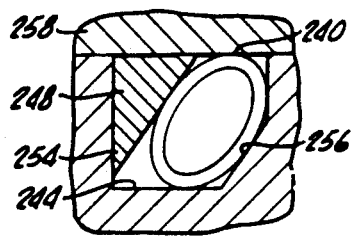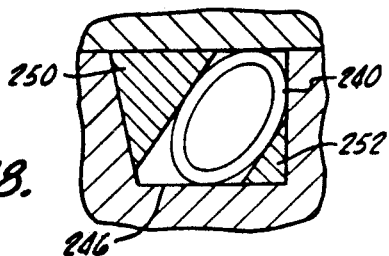

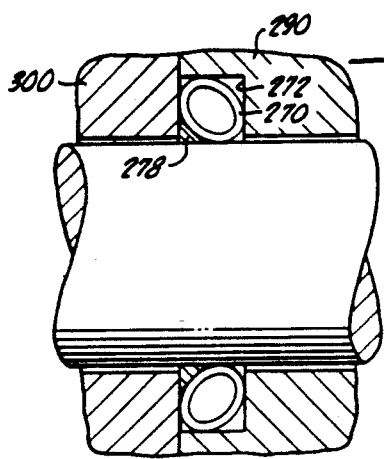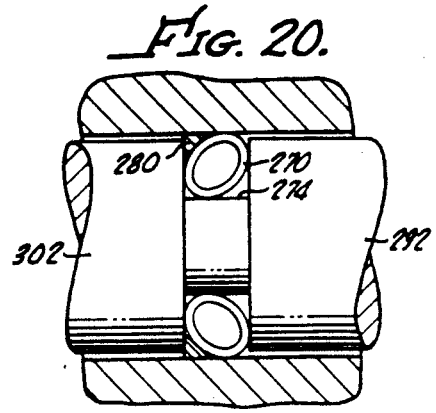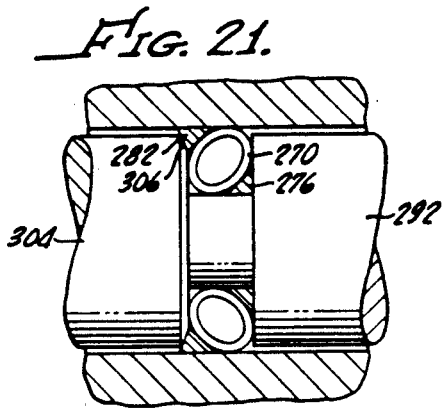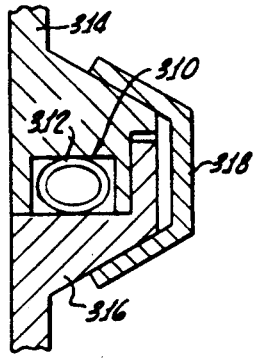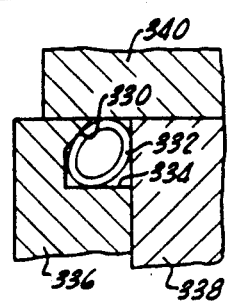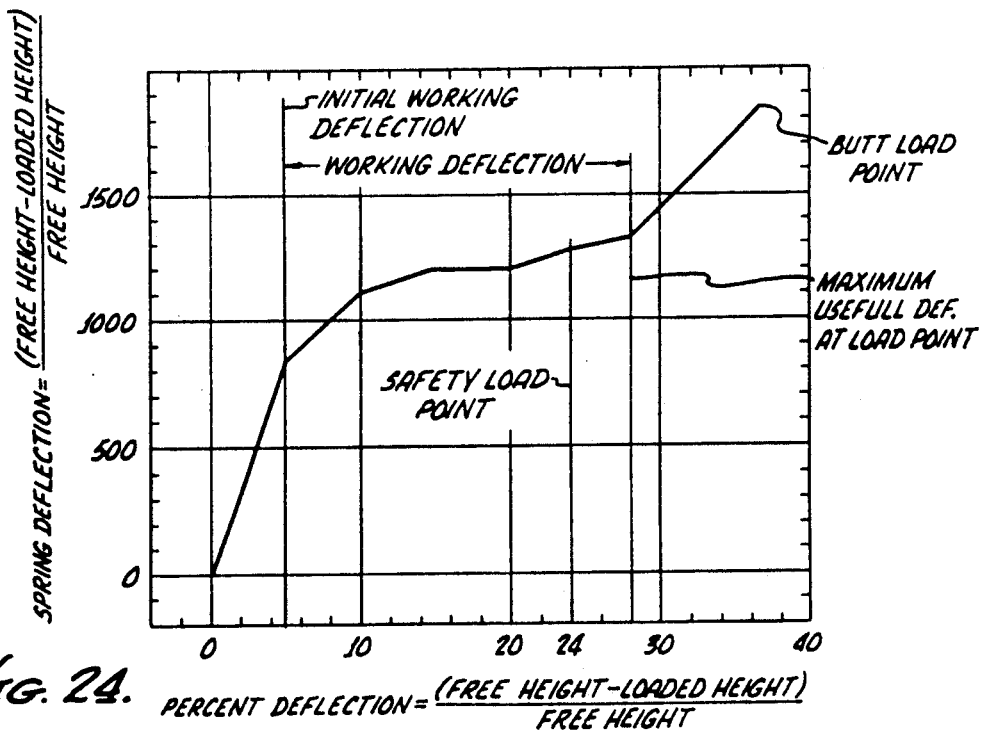

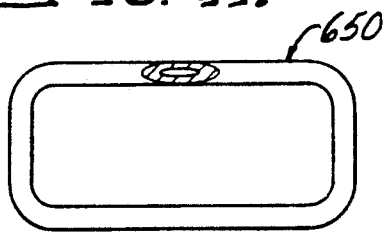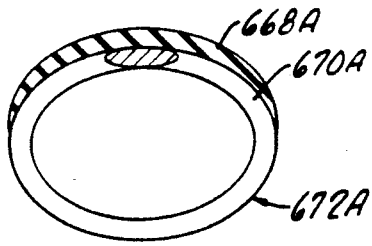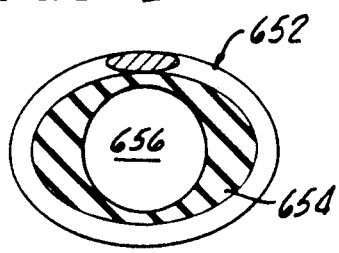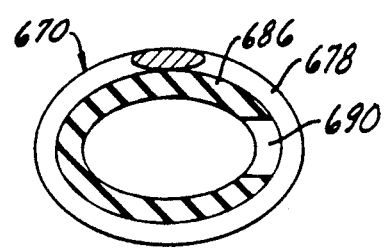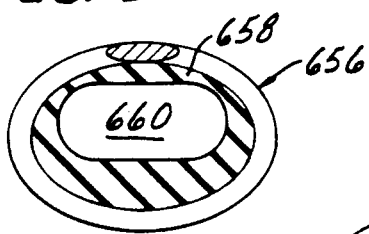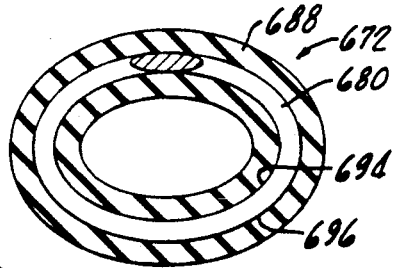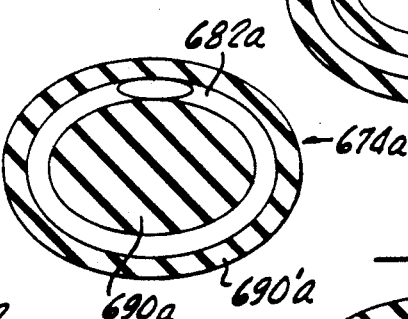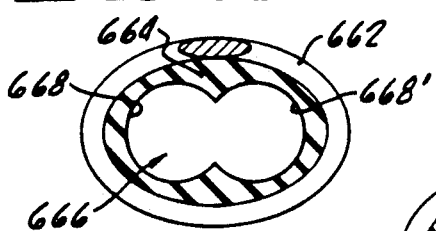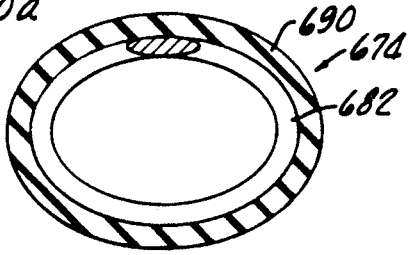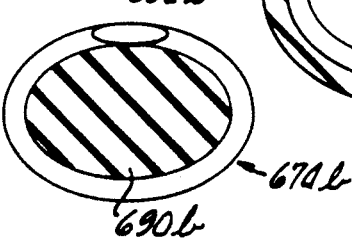

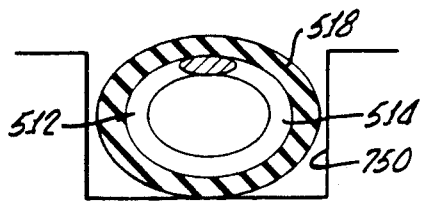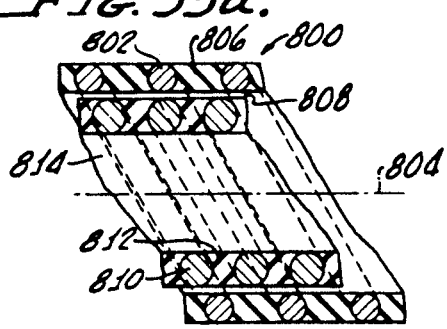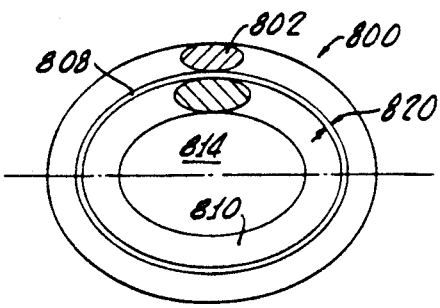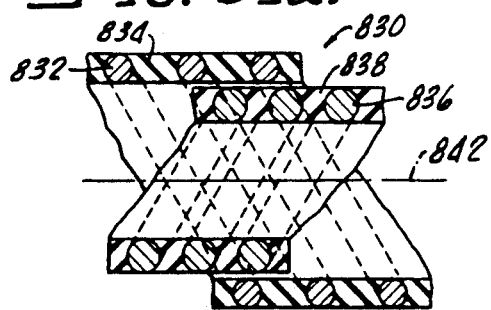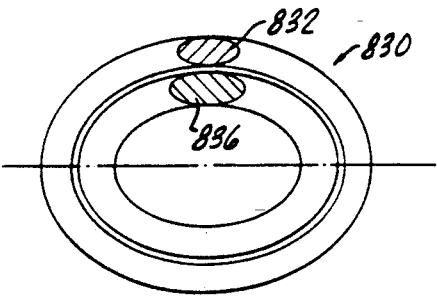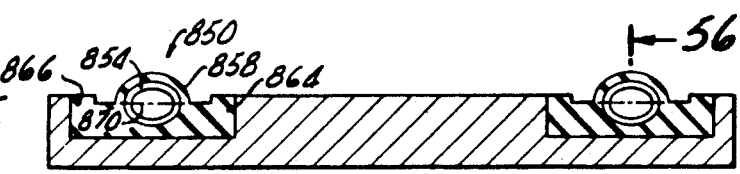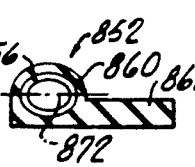

GASKET FOR SEALING ELECTROMAGNETIC WAVES FILLED WITH A CONDUCTIVE MATERIAL

The present application is a continuation-in-part of U.S. patent application Ser. No. 568,909, filed Aug. 17, 1990, which is a continuation-in-part of U.S. patent application Ser. No. 444,287 filed Dec. 1, 1989 and U.S. patent application Ser. No. 463,480 filed Jan. 11, 1990. U.S. Ser. Nos. 444,287 and 463,480 are to be totally incorporated, including drawings, into the present application by this specific reference thereto. The present application is also a continuation-in-part of U.S. patent application Ser. No. 572,242, filed Aug. 27, 1990, which is a continuation-in-part of U.S. patent application Ser. No. 496,329, filed Mar. 20, 1990, these references being made to totally incorporate, including drawings, patent application Ser. Nos. 572,242 and 496,329 into the present application.

The present invention generally relates to canted-coil springs and seals and, more particularly, relates to canted-coil springs retained in a cavity with interference between the spring coils and the cavity to retain the spring in a selected orientation for subsequent loading of the spring. Orienting the spring for major or minor axis loading enables a specific selected resilient, or load-deflection, characteristic in response to the subsequent loading of the springs.

In addition, the present invention generally relates to compression springs which exhibit predetermined resilient, or load-deflection, characteristics and particularly related to canted-coil springs that are filled with an elastomer or plastic material having a hollow coil cross-section. It is well known that canted-coil springs can be manufactured so that within a certain range of deflection thereof, the force developed remains relatively constant. The advantages of these types of springs is pointed out in U.S. Pat. No. 4,655,462 to Balsells. Although the coil size, coil spacing, wire diameter, the angle the coils are canted with a center line of the spring have been widely investigated in order to tailor the resilient characteristics of the spring to meet the needs of a proposed application, investigation continues in order to provide a wider range of spring resilient characteristics in order to expand the usefulness of the canted-coil spring in industry.

Heretofore, there has been no attempt, however, to utilize an elastic or plastic in order to modify the force exerted by the spring assembly in response to deflection of the spring along a loading direction. Prior use of plastic material in combination with a canted-coil spring has been limited to the use of a canted-coil spring imbedded in an elastic material to provide a reinforcement therefor, totally sacrificing any load-deflection characteristics of the spring.

It is well known that when an O-ring is loaded, the force developed thereby is generally directly proportional to the deflection; thus, in the case of U.S. Pat. No. 3,183,010 to Bram, when the canted-coil spring is imbedded in the O-ring elastomer, it only provides in combination therewith a higher force which is directly proportional to the deflection. Thus, any advantage that a canted-coil spring may otherwise provide is sacrificed in this combination.

The present invention is directed to a canted-coil spring-elastomer combination which not only maintains the important force deflection characteristics of the canted coil spring but may be used to enhance advantageous characteristics thereof, in addition to facilitating the tailoring of the combination to meet the demands of apparatus configurations not possible by a canted-coil spring alone, an O-ring, or a combination thereof.

It should be appreciated that cavities as hereinafter discussed may be linear or continuous with a desired shape, be it circular or otherwise. For as in circular cavities, the spring may have end coils welded forming a garter-type canted-coil spring.

It is generally well known that electromagnetic transmission may be described by wave theory and, further, in terms of an electric and a magnetic field which travel in a 90° phase relationship with one another in free space. Wave theory describes electromagnetic energy in terms of wavelength and amplitude.

It should be appreciated that electromagnetic energy is used here as a generic term including the full spectrum of electromagnetic energy frequencies. Generally speaking, electromagnetic interference (EMI) and radio frequency interference (RFI) are used to describe interference caused by unwanted electromagnetic energy or radio frequency energy entering or leaving a designated piece of equipment.

The ability to shield a component from egress or ingress of electromagnetic energy is often called shield effectiveness.

Microwave energy having frequencies from about 100 kHz to about 300 gHz is commonly referred to as microwaves. The microwave frequencies spectrum may be further divided into three general groups, which include commercial bands, 100 kHz to 10 gHz; military bands, 10 gHz to 50 gHz; and millimeter bands, 50 gHz to 300 gHz.

Shield effectiveness of any particular frequency range is significantly affected by any gaps or openings therein which will allow electromagnetic fields to radiate therethrough unless current continuity can be preserved across the opening. The importance of the opening is, of course, dependent upon the frequency of the impinging electromagnetic energy. It should be understood that the shielding effectiveness is a measure of the efficiency of an EMI gasket measured in decibels (dB), the higher the shielding effectiveness, the more effective a gasket is. Such shielding effectiveness is affected by the opening between coils and an "aperture," as herein used, is defined as the maximum linear dimension (not area) of this opening. The greater the size of the aperture, the lower the shielding effectiveness. The aperture is the maximum shielding effectiveness.

Two general types of spring gaskets disclosed in the present invention include one having spacing between coils when loaded and another having coils butted at load. The butted coils provide the smallest aperture and thus the maximum shielding effectiveness.

The length of the aperture in a spring gasket, as hereinafter disclosed, is affected by the wire diameter, the D/d ratio, and the spacing between coils.

As a general rule, for effective shielding in commercial use, the opening size should be less than the wavelength of the electromagnetic energy divided by 20. For military bands, the opening size should be less than the wavelength divided by 50 and for the millimeter bands, the opening should be less than the wavelength divided by 200. Because of the dependence on the wavelength, the effectiveness of any gasket may be determined at a particular frequency the size of the openings or apertures therein.

Heretofore available gaskets have been unable to provide dimensional stability throughout the life of equipment in order to prevent the formation of unwanted gaps therein which may be unacceptable in terms of shield effectiveness. This is especially true when the gaskets are utilized in situations where repeated disassembly and assembly are needed with the gasket relied on to prevent EMI or RFI between components requiring such assembly.

The gasket of the present invention, however, provides an effective electromagnetic shield through the use of a plurality of conductive wire coils and means for loading the plurality of coils in a manner so that the coil spacing may be adjusted in selected areas along the circumference thereof in order to provide an electromagnetic shield. In addition, the gasket of the present invention provides sufficient biasing capability to make up for variations that may occur due to torquing, eccentricities, irregularities and other variables, and maintain intimate contact between mating surfaces under load.

It has also been found that shielding a spring gasket in accordance with the present invention, the conductive material further improves the shielding effectiveness by reducing the size of an aperture that occurs when a spring gasket is used by itself. The shielding effectiveness of the gasket is further enhanced when the conductive material is formable, as will be hereinafter described in greater detail.

SUMMARY OF THE INVENTION

An electromagnetic shielding gasket assembly in accordance with the present invention generally includes a coil spring which provides means for blocking the propagation of electromagnetic waves therepast, with the coil spring including a plurality of coils individual canted along a center line thereof. Additionally, means are provided for supporting the plurality of coils in an orientation for controlling the electromagnetic shielding effectiveness of the coiled spring, and formable conductive means is provided and disposed on the plurality of individual coils for being formed by the plurality of coils upon the loading thereof. The loading forms the conductive means and fills an aperture of the coil spring means to further block the propagation of electromagnetic waves. In addition, means may be provided which cooperate with the means for supporting the plurality of coils for loading the plurality of coils to control the aperture of the coil spring means through which the electromagnetic waves can propagate.

More particularly, the electromagnetic shielding gasket assembly according to the present invention may include individual coils interconnected in a manner forming a continuous circular coil spring. The formable conductive means may comprise a nonconductive elastomer with conductive fibers therein, or comprise a soft metal, preferably tin.

When the individual coils are fabricated from a wire having a diameter, d, selected to achieve a desired shielding effectiveness, the shielding effectiveness increases with the increasing wire diameter. Additionally, when the individual coils are formed with the coil diameter, D, selected to achieve a desired shielding effectiveness, shielding effectiveness decreases with increasing D/d ratio.

More particularly, the coil spring may have a turn angle greater than 0° and a means for supporting the plurality of individual coils includes groove means for increasing the turn angle of the circular coil spring to control the aperture of the circular coil spring through which electromagnetic waves may propagate.

In one embodiment of the present invention, the means for supporting the plurality of coils includes means for causing the individual coils to abut upon one another. In this embodiment, when the individual coils are fabricated from wire having a diameter, d, selected to achieve a desired shielding effectiveness, the shielding effectiveness decreases with increasing wire diameter. Also, when the individual coils are formed with the coil diameter, D, selected to achieve a desired shielding effectiveness, the shielding effectiveness increases with the increasing D/d ratio.

More particularly, the means for causing individual coils to abut may comprise a wedge which may be an integral part of the groove means or disposed within a groove and not fixed thereto.

When sufficient formable means are provided, the electromagnetic shielding gasket assembly additionally functions as a low pressure seal.

BRIEF DESCRIPTION OF THE DRAWINGS

The advantages and features of the present invention will appear from the following description and considered in conjunction with the accompanying drawings in which:

FIG. 12 is a radially resilient electromagnetic gasket disposed in a housing groove;

FIG. 13 is a radially resilient electromagnetic gasket disposed in a shaft groove;

FIG. 14 is a diagram of an axially resilient electromagnetic gasket showing the loading thereof and showing a wedge for deflecting the gasket along the minor axis thereof, to a butt angle position;

FIG. 15 is an alternative embodiment of the present invention;

FIGS. 16, 17 and 18 are alternative embodiments of the present invention utilizing differently shaped wedges and grooves;

FIGS. 19, 20 and 21 are alternative embodiments of the present invention showing a wedge in position for compressing a radially resilient electromagnetic gasket;

FIG. 22 shows a typical application of an embodiment of the present invention;

FIG. 23 shows an alternative embodiment of the present invention in which the groove is defined by mating portions thereby preloading the spring before loading thereof by a third mating member;

FIG. 24 is an axial or radial load deflection curve for a typical axially resilient electromagnetic coil spring in accordance with the present invention;

FIG. 41 shows an axial spring with an irregular shape in accordance with the present invention having a hollow interior;

FIGS. 42-45 show various inner cross-sectional configurations in accordance with the present invention having a hollow interior;

FIGS. 46-48, 48a and 48b show variations in encapsulation of the coils of the present invention with an elastomer;

FIG. 52 is a cross-section view of a spring in accordance with the present invention disposed in a groove;

FIGS. 53a and 53b are views of an alternative embodiment of the present invention showing a first plurality of coils with an elastic material thereabout and a second plurality of coils coaxially disposed therein with an elastic, material thereabout;

FIGS. 54a and 54b show an alternative embodiment of the present invention in which the first and second plurality of coil means being canted in opposite directions, and the elastic material has a substantially greater dimension that the diameter of the plurality of coils which provides a means for positioning the plurality of coils in order that the loading direction is approximately perpendicular to the center line tangent;

FIG. 55 is a sectional view of an alternative embodiment of the present invention showing the mounting of the spring assembly utilizing portions of an elastic member to position the coils;

FIG. 56 is a cross-section view of FIG. 25 taken along the line 56—56;

FIG. 57 is an alternative embodiment of the present invention showing an alternate shape of the elastic member.

DETAILED DESCRIPTION

A resilient electromagnetic shielding gasket in accordance with the present invention may be described, in part, by its load-deflection characteristics.

Depending on its application, a number of load-deflection characteristics may be utilized; however, of particular use is a gasket which exerts a generally constant force in response to deflection of the gasket. This feature enables the gasket, in accordance with the present invention, to accommodate variations in mating surfaces between which electromagnetic shielding is to be provided. Such variations may be due to surface irregularities, tolerances, or temperature and pressure effects. The shielding gasket provides a stable, long-lived gasket capable of shielding against electromagnetic radiation in a consistent manner over time, despite temperature and pressure effects, and/or continued assembly and disassembly of mating parts.

Figure 1:
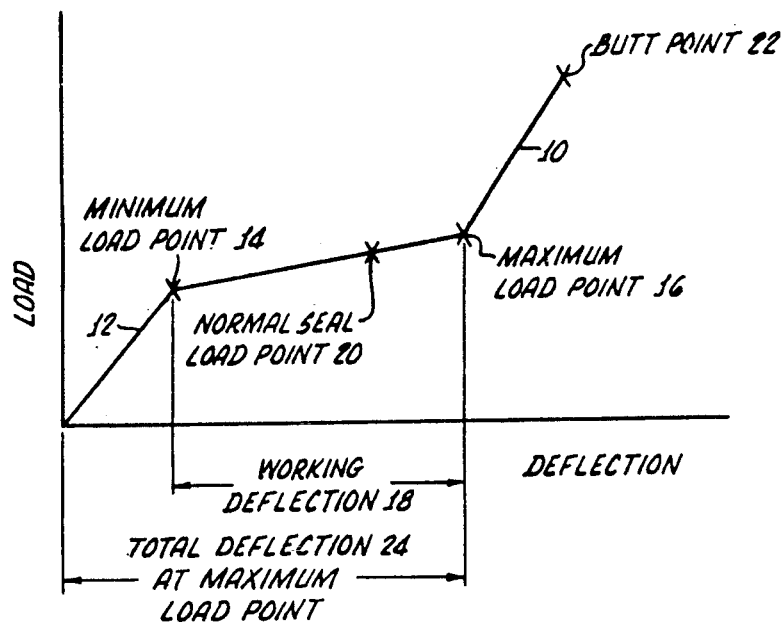
FIG. 1 is a theoretical load vs. a deflection curve illustrating the various parameters of an electromagnetic shielding gasket in accordance with the present invention.

For the purposes of describing a desirable load-deflection characteristic, an exemplary load-deflection curve 10 is shown in FIG. 1. As can be seen when a load is applied to the gasket, it deflects in a generally linear fashion as represented by the line segment 12 until it reaches a minimum load point 14 which represents the point at which, after the initial deflection, the load remains relatively constant and relatively independent of gasket deflection.

It should be appreciated that for an axially resilient gasket, hereinafter described, the load is applied axially and for a radially resilient gasket, hereinafter described, the load is applied radially.

Between the minimum load point 14 and a maximum load point 16, the load-deflection curve may be constant or show a slight increase as shown in FIG. 1. The area between the minimum load point 14 and the maximum working load point 16 is known as a working deflection range 18.

The gasket is normally loaded for operation within this range, as indicated by the point 20, for a typical gasket in accordance with the present invention, for electromagnetic shielding purposes. In addition, the gasket also may provide sealing between the mating surfaces.

Loading of the gasket beyond the maximum load point 16 results in an abrupt deflection response until it reaches a butt point 22, which results in a permanent set in the gasket as a result of overloading. Also indicated ind FIG. 1 is the total deflection range 24, which is defined as the deflection between the unloaded gasket ad the deflection of the maximum working load point 16.

A gasket, as hereinafter identified, in accordance with the present invention, may assume many forms. For example, it may be linear, have any irregular shape, or be interconnected to form a round, elliptical or other continuous shape, as hereinafter discussed.

Figure 2:
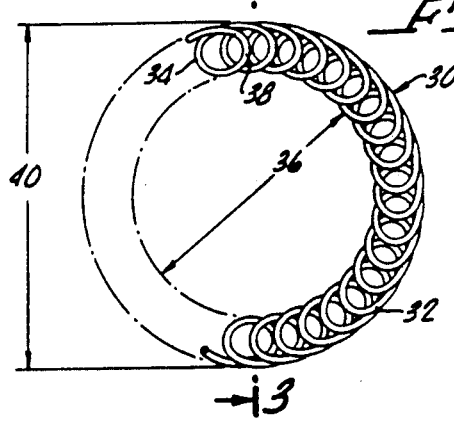
FIG. 2 is a plan view of an electromagnetic shielding gasket in accordance with the present invention in which coils are interconnected in a manner forming an axially resilient coil gasket with a trailing portion having a back angle along an inside diameter of the gasket and a leading portion having a front angle along an outside diameter of the gasket, the coils being interconnected to produce a clockwise canting of the coils (the coils also may be interconnected to produce a counterclockwise canting; see FIG. 4)

First, an axially resilient electromagnetic shield, or gasket, 30, as shown in FIG. 2, may have a plurality of coils 32 interconnected in a manner such that a trailing portion 34 (see FIG. 3) is along an inside diameter 36 of the gasket 30 and a leading portion 38 is along an outside diameter 40 of the gasket 30. FIG. 2 shows the gasket 30 interconnected and wound with a clockwise canting of coils. An alternative embodiment (not shown) may be made as described in FIGS. 2 and 3 but having the coils instead canting in a counterclockwise and wound in a counterclockwise direction as shown in FIG. 4.

Figure 3:
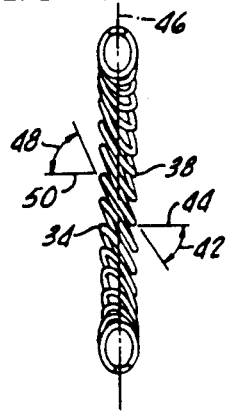
FIG. 3 is a cross-sectional view of the gasket shown in FIG. 2 taken along a line 3—3 and showing the relative position of the back angle and the front angle of the spring.

From FIG. 3, it can be seen that the back angle 42 provides means for defining the disposition of the trailing portion 34 of each coil with respect to aline 44 normal to the center line 46 and a front angle 48 provides means for defining the disposition of the leading potion 38 of each coil with respect to a normal line 50. The back angle 42 additionally determines the working resilient range of the gasket as disclosed in U.S. Pat. Nos. 4,826,14 and 4,915,366. Specific details of the use of the back angle to determine the gasket resilient range are disclosed within these references, which are incorporated herewith by specific reference thereto, and not discussed in detail herein as they are disclosed in the cited references.

Figure 5:
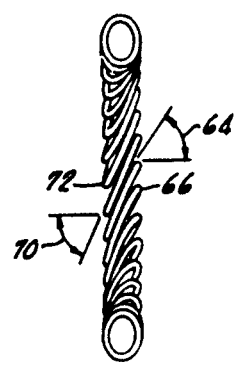
FIG. 5 is a cross-sectional view of the electromagnetic gasket of FIG. 4 taken along the line 505 and showing the relative positions of the front and the back angle.
Figure 4:
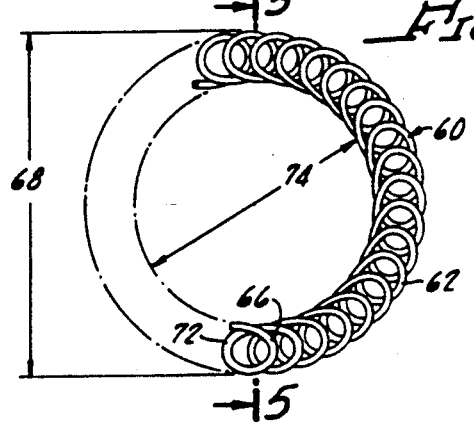
FIG. 4 is a plan view of an electromagnetic shielding gasket in accordance with the present invention in which the coils are interconnected to define an axially resilient electromagnetic shielding gasket with a trailing portion having a back angle along an outside diameter of the gasket and a leading portion having front angle along an inside diameter of the gasket, the coils being interconnected to produce a counterclockwise canting of the coils (the coils also may be interconnected to produce a clockwise canting; see FIG. 2)

Turning now to FIGS. 4 and 5, there is shown an axially resilient circular gasket 60 having a plurality of coils 62 interconnected in a fashion providing a counterclockwise canting of coils and as shown in FIG. 5, having a back angle 64 defining a trailing portion 66 along an outside diameter 68 and a front angle 70 defining a leading portion 72 along the inside diameter 74 of the gasket 60.

FIG. 4 shows the gasket 60 interconnected and wound with a counterclockwise canting of coils. An alternative embodiment (not shown) may be made as described in FIGS. 4 and 5 but having the direction of canting in a clockwise direction (see FIG. 2). In addition, the direction of winding may be reversed.

Figure 6:
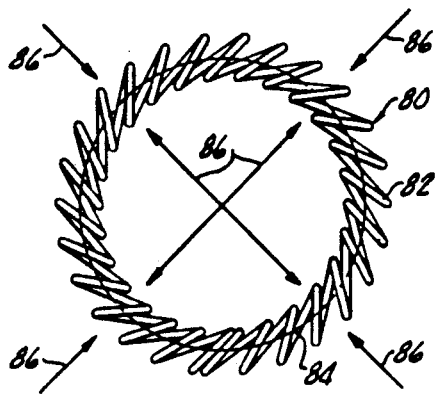
FIG. 6 is an electromagnetic gasket in accordance with the present invention in which the coils are interconnected to form a radially resilient electromagnetic gasket.

As shown in FIG. 6, another embodiment of the present invention, an electromagnetic gasket 80 may include a plurality of conductive coils 82 canted along a center line 84 thereof and interconnected in a manner forming a circular radially resistant gasket. Loading of the gasket 80 occurs in a radial manner as indicated by the load arrows 86.

Figure 7:
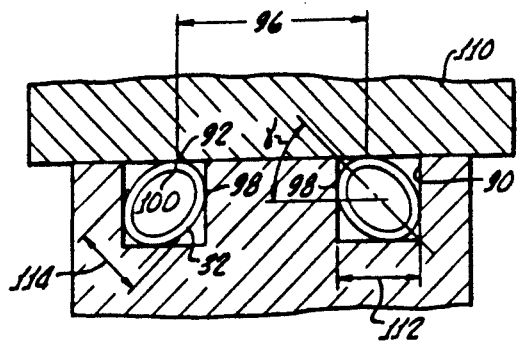
FIG. 7 shows an axially resilient electromagnetic gasket disposed in a cone position and having a load turn angle which may vary, but is shown therein at about 45°.

Turning now to FIG. 7, there is shown in a diagrammatic cross-sectional manner the axially resilient gasket 30 disposed in a groove 90, which provides means for preloading the plurality of coils 32 in a manner causing coil spacing along the circumference of the inside diameter of the spring as loaded to be less along the inside diameter 98 and such spacing to increase progressively at seal-load 92 of each coil 32 and increase further towards the O.D. of the spring.

The coil spacing along the seal-load portions 92 is selected to limit the passage of electromagnetic energy with a wavelength greater than a selected value.

Figure 8:
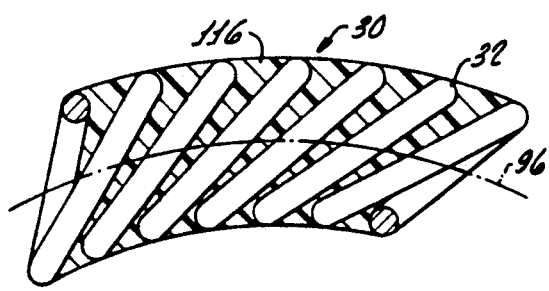
FIG. 8 is a perspective view of the axially resilient electromagnetic gasket of FIG. 7 taken along a load line and showing a load line, or circle, at which a portion of each coil in the electromagnetic gasket has a spacing between coils, filled with a formable conductive material as hereinafter discussed.

To more clearly show the relationship of the seal-load portion 92, a diagrammatic perspective view taken along a load circle 96 is shown in FIG. 8. The load line/circle 96 being collectively defined by the seal-load portions 92 of the coils 32.

As shown in FIG. 7, load sealing points 100 are coincident with the load circle 96 when the gasket 30 is disposed in the groove 90 at a load turn angle Y which may be from about 1° to 90° and preferably 45°. The gasket 30 is shown in a "cone" configuration and as such develops a load circle which is disposed closer to the gasket inside diameter 36 than the outside diameter 40 (see FIG. 2). After assembly of the gasket 30 into the groove 90, it is generally loaded by a flange 110.

The best shielding effectiveness with the spring described in FIGS. 7 and 8 is achieved when the aperture is at a minimum which occurs when the wire diameter is at maximum, the D/d ratio is at a minimum, and the spacing between coils is at maximum.

The groove width 112 may be either smaller, equal to or larger than the coil height 114. However, it is preferable that the groove width is greater than the coil height as there is less possibility of spring damage upon loading the spring.

In the configuration shown in FIG. 7, the gasket 30 will have a force-deflection characteristic which generally provides a force versus deflection where the force remains generally constant within the working deflection. However, if the assembly turn angle (see FIG. 35) is greater than 70°, there will be a tendency for snapping of the spring, which can occur when the groove width is equal or smaller than the coil height, especially when the spring back angle is between 0 and 10 degrees which causes the force versus deflection curve to rise rapidly above the constant force, and this is an indication that the fatiguing of the gasket may occur.

Figure 8A:
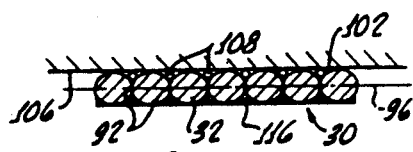
FIG. 8a shows, in cross-section, an alternative embodiment in which the coils may abut upon preloading or loading thereof.
Figure 8B:
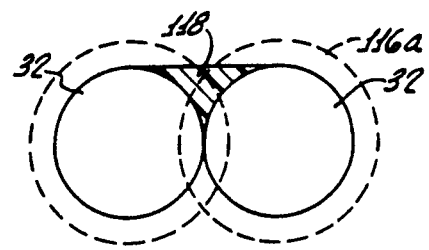
FIG. 8b is a diagram showing plating, or coating, thickness necessary to achieve environmental sealing.

As shown in FIG. 8, 8a and 8b the gasket 30 includes a conductive material 116 disposed between the coils 32 in order to improve shielding effectiveness of the gasket 30 by reducing the size of the aperture 102 (see FIG. 8a). Upon loading of the gasket, the conductive material 116 moves, or is formed into a shape 118 conforming to and filling the apertures 102.

By partially or completely surrounding the spring gasket 30 with the conductive material 116, a substantial improvement in shielding effectiveness can be obtained. The total shielding effectiveness, of course, depending on the type of conductive material 116 utilized, and the manner in which such conductive material 116 is applied within the spring gasket 30.

Various types of conductive fillers may be used and may be either nonmetallic, combinations of metallic and nonmetallic materials, and metallic materials.

Examples of the nonmetallic conductive materials include carbon or graphite, which may be in the form of a powder, sheeting, fiber, among others. The combination of a nonmetallic and metallic conductive material may include materials such as elastomer, plastic, or adhesives which are the carriers for metallic materials, such as nickel, aluminum, silver, copper, tin or iron, or metallic materials all being of a soft metal. As is well-known in the art, the metallic materials within the carrier may be in the form of powder, fiber, shavings, or any other suitable configuration. In addition, the nonmetallic carrier may include nonmetallic materials such as carbon and graphite in the form of power, fiber, or sheeting, etc.

Metallic materials such as those hereinabove recited may be used exclusively as the conductive material and may be in any form suitable for applying to the coils 32.

As hereinafter discussed in greater detail, the conductive material 116 may cover the spring gasket 30 partially or totally with the spring gasket 30 having either a solid cross-section or a hollow cross-section as hereinafter described in the application of the spring gasket and the shielding effectiveness desired. Various well-known methods for applying the conductive materials to the spring gasket 30 may be utilized which include spraying, plasma coating, molding, extruding, plating and dipping, among others.

Depending upon the flexibility desired for the application, a higher degree of bonding between the conductive material 116 and the coils 32 may be selected. Obviously, for those applications in which a strong bonding between the conductive material 116 and the coils 32 is desired, the spring gasket 30 will exhibit a greater degree of rigidity.

In addition to providing shielding effectiveness, the gasket 30 may provide environmental as well as low pressure sealing. This is achievable when using elastomers, certain plastics adhesives, or metallic materials. Such elastomers, plastics and adhesives may be filled with a conductive material, such as carbon, graphite and metallic materials, such as nickel, aluminum, tin, etc.

A series of tests were conducted to determine the environmental sealing ability of canted-coil spring electromagnetic gaskets 30 using an elastomeric material 116 filled with a nickel powder material as the conductive material. The gasket 30 was housed in a rectangular groove (See FIG. 7) and environmental sealing was achieved. Complete sealing was achieved up to a pressure of about 5 psi nitogen.

For the greatest shielding effectiveness, metallic materials, such as those hereinabove set forth, provide substantially greater shielding effectiveness, as opposed to filled materials. Specifically, the most preferred embodiment for effective shielding is one in which the coils 32 are surrounded by a soft metallic material, such as tin, as hereinabove set forth. Upon loading the spring gasket, the coils 32 will cause the tin to form or flow into the apertures 102 as shown in FIG. 8a, thus creating a barrier to electromagnetic waves.

It should be appreciated that when coating the coils 32, it is necessary to provide sufficient thickness of the coating so that upon loading of the spring gasket 30, there will be sufficient conductive material 116 to fill all the voids that occur between the coils 32 upon loading.

It should be appreciated that as the utilized wire diameter increases, certain limitations occur due to the ability to plate a sufficient thickness of material on the wire to fill the voids. In this instance, it may be desirable to dip the coils 32 into melted soft metal, tin, in a manner to surround the spring gasket.

As hereinabove set forth, flexibility of the spring gasket 30 with the conductive material, such as elastomeric-plastic carrier with conductive fillers, varies depending upon the number of factors such as the filler material, the manner in which the filler, or conductive material, 116 surrounds the spring and the bonding of the conductive material 116 to the spring coils 32. With sufficient conductive material thickness, the gasket is suitable for environmental or low pressure sealing as well as functioning to block electromagnetic waves. Naturally, the hardness and flexibility of the conductive material 116 affects such environmental sealing.

The amount of conductive material 116 in the form of plating or coating 116a (see FIG. 8b) necessary for environmental sealing varies with wire diameter. For example, a wire diameter of about 0.010 inch (as shown in FIG. 8b) will require a plating 116a of about 0.002 inches thickness whereas a wire diameter of about 0.030 inches will require a plating 116a of about 0.004 inches thickness.

The amount of plating 116a (shown as dashed line in FIG. 8b) necessary to effect environmental sealing is that amount necessary to fill the aperture 118 between the wires 32 when the plating 116a is formed, or moved, by the wire coils 32 under load to cause abutment thereof (as shown in FIG. 8b), the plating 116a being forced into the aperture.

The degree of bonding can be determined by a number of factors such as the manner in which the spring coils 32 are treated prior to application of the conductive material 116. It should be readily appreciated that for applications where a high degree of bonding is desirable, the surface of the coils 32 may be treated, etched or roughened or any combination of these methods.

As hereinabove noted, FIG. 8a shows a cross-section of the gasket 30 which is loaded with coils 32 abutting which shows a minimum area 102 subtended by the surface of adjoining and abutting coils 32 and a load surface 106. A conductive wire 108 may be disposed between abutting coils 32 in the area 102 for providing insert means to further limit the passage of electromagnetic therepast, or between the abutting coils 32. The conductive insert wire 108 may have a circular or V-shape cross-section in order to more fully occupy the area 102.

Figure 9:
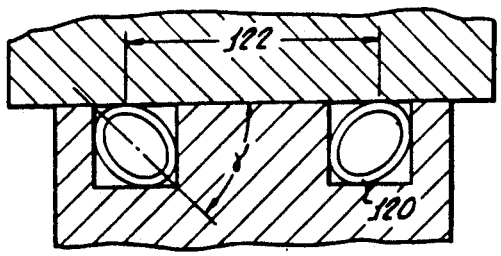
FIG. 9 is an axially resilient electromagnetic gasket shown in a loaded position and in an inverted cone position in which the load turn angle may vary, but is shown therein at about 45°.

Turning now to FIG. 9, there is shown an alternative embodiment of the present invention in which an axially resilient gasket 120 is shown in a loading position having a load turn angle which may be between 1° and 90°, a preferred load turn angle of 45° being shown. The gasket assumes an inverted cone shape and the position of the gasket is similar to the axial cone gasket except that upon assembling the gasket into the cavity, it is an inverted position which is 180° from the cone position. The load circle 122 is substantially larger than in the axial cone type spring 30 and this allows greater open spacing between the coils at the load circle 22. The force vs. deflection characteristics of this type gasket is shown in FIG. 1, with an initial higher peak above the constant force when the assembly turn angle γ (see FIG. 35) is greater than 70° and the spring back angle is at the O.D. instead of the I.D.

Figure 10:
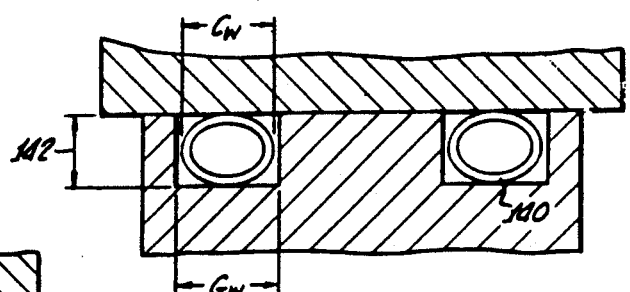
FIG. 10 is an axially resilient electromagnetic gasket loaded along the minor axis thereof with a spring load turn angle of about 0°.

Shown in FIG. 10 is an axially resilient gasket 140 as shown loaded along a minor axis 42 thereof. In this instance, the groove width $G_w$ is greater than the coil width $C_w$.

Figure 11:
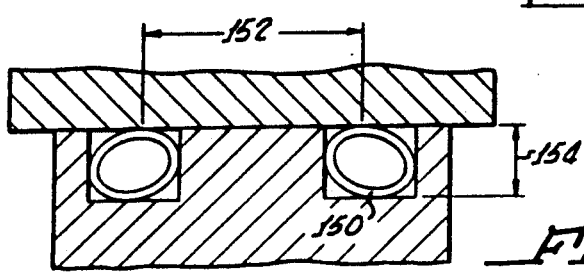
FIG. 11 is an axially resilient electromagnetic gasket loaded along the minor axis thereof, forming a cone, the load turn angle may be from 0° to about 30°. As shown, it is about 15°.

Another positioning of an axially resilient cone gasket 150 is shown in FIG. 11 in which the axial turn angle is between 0° and about 30°, and the load along the load circle 152 is along a minor axis 154 of the gasket 150. More detailed description of a coil preloading and loading within the groove will be hereinafter discussed in greater detail.

Shown in FIGS. 12 and 13 are radial resilient gaskets 160, 162, respectively, in accordance with the present invention, shown within grooves 164 and 166, formed in a housing 168 and a shaft 170, respectively.

The hereinafter discussed parameter regarding the positioning of the springs 160 and 162 within the grooves 164, 166, respectively, are similar to the groove spring relationship, as hereinafter discussed in connection with the axially or radially resilient gaskets 30, 120, 140 and 150.

Figure 12A:
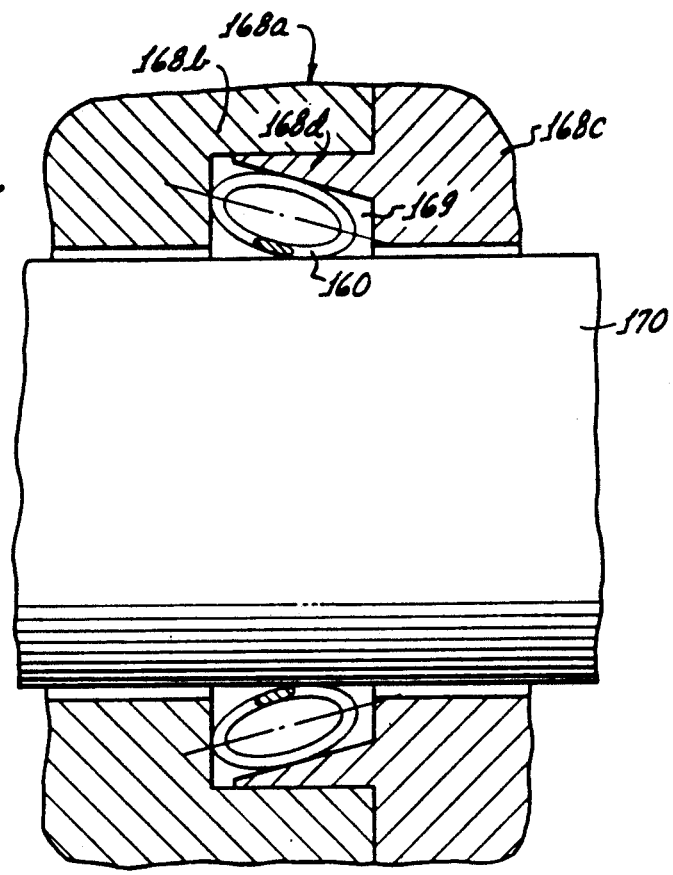
FIG. 12a is an electromagnetic shielding gasket assembled into housing grooves with a wedge providing means for loading the coils from the outside diameter towards the inside diameter causing the coils to progressively butt from the inside diameter towards the outside diameter.

FIG. 12a shows the spring 160 disposed in a housing 168a having two portions 168b, 168c with a wedge 168d for defining a cavity 169 between the housing 168a and shaft 170. When assembled, the wedge 168d loads the cavity 169 in a manner causing the spring 160 to but towards the inside diameter.

FIG. 14 shows an enlarged view of an axially resilient electromagnetic shielding gasket 172 within a groove, or cavity, 174 and further including a wedge 176 which may be suspended in the groove 174 and biased by the plurality of coils 178 against an opposing loading surface 180 in order to cause coil spacing along the circumference of adjoining coils to be less along the I.D. of the spring gasket at 206 when in a loaded position than along other coil portions 184 along the circumference thereof. At a load circle 190 the spacing between coils when loaded will be slightly greater than at circumference 206 and such spacing between coils will progressively increase from the I.D. of the spring circumference to the O.D. when loaded.

An important feature of the wedge 171 is the enablement of the coils 178 to abut without causing fatigue, or permanent set, thereof which may alter the rotation of the coils 178 within the groove 174 and thereby reduce the shielding effectiveness of the gasket 172 upon repeated disassembly and assembly of flange 110 and housing 110a (see FIG. 7). The wedge prevents fatigue by rotation of the coils 178 in a manner increasing the turn angle thereof as herein described.

With proper selection of coil groove and wedge dimensions, the coil can be made to abut along the load circle yet be in a spaced-apart relationship along other portions 184 of the circumference. Wedge 176 is shown as a separate part; however, it can also be made as an integral part of the loading surface 180.

Figure 13A:
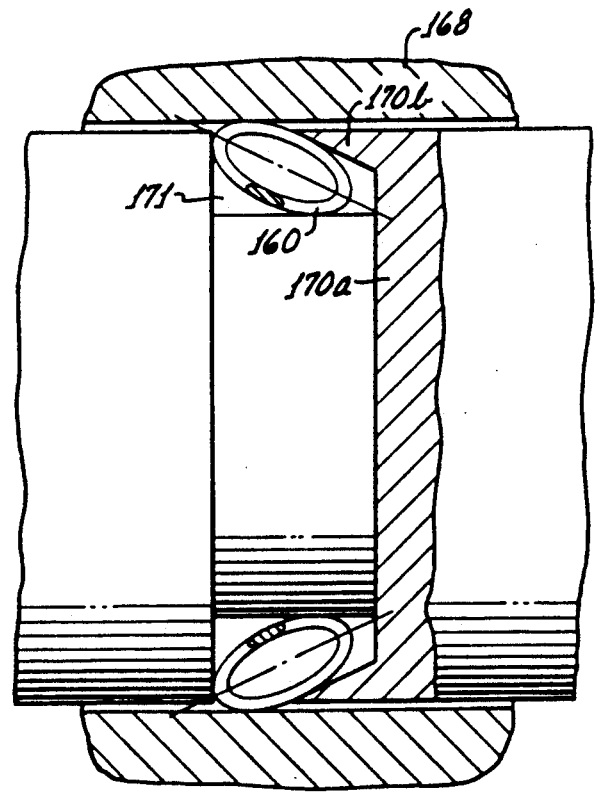
FIG. 13a is an electromagnetic shielding gasket assembled in a piston groove with a wedge providing means for loading the coils in a manner causing the coils to deflect and progressively butt from the inside diameter to the outside diameter.

The separate wedge has the significant advantage that it can accommodate itself to the cavity 174 and may provide substantially better shielding effectiveness than built-in wedge, shown in FIGS. 12a and 13a, in cases where the wedge is sufficiently flexible to be able to be deflected by the spring gasket 172.

On the other hand, the built-in wedge has the significant advantage that the wedge and the loading means are in one unit, thus making it easier to fabricate, assemble and load.

As shown In FIG. 14, the groove width $G_w$ may be equal to the groove depth $G_D$ and, for example, these dimensions may be in the order of 0.15 inches. The gasket 172 may have a coil height 194 at turn angle 196 of approximately 45° and a coil width 198 of approximately 0.168 inches and be formed from wire having approximately 0.16 inch diameter.

As the gasket 172 is loaded within the groove 174 by the wedge 176, rotation of the spring occurs from the 45° load angle 196 to a butt turn angle 202, the load circle 190 being shown at the butt point. It can be seen that the coil height 194 decreases as the spring turns, decreasing the load circle and therefore reducing the open spaces considerably. As the spring 172 is deflected, the coils 178 being to butt at the minimum inside diameter 206. As loading then occurs along the load circle, the coils will butt towards the inside diameter 208.

As shown in FIG. 8a showing abutting coils, minimum spacing occurs between the coils when they butt. In this case, the maximum dimension of the exposed space 102 is equal to the wire diameter.

An alternative embodiment of the present invention is shown in FIG. 15 in which a gasket 220 is disposed in a groove 222 and biased by a wedge 224 having a greater width than height. Wedge 224 can also be made as an integral part of the load surface as hereinabove described. Utilizing wedges 224 of different configurations, as for example, shown in FIG. 15, the rate of butting of the coil 220 from the inside diameter to outside diameter as hereinabove described in connection with the gasket 172 may be varied. This enables load-deflection characteristics to be achieved with various groove widths $G_w$ and groove depths $G_D$.

It is important that along the load circle the coils either approach a butting relationship or remain in a butting relationship within the specific tolerances of the gasket and the groove dimensions. The fact that the coils butt from the inside diameter towards the outside diameter allows for a variation and tolerances of the groove and the gasket so as to avoid a complete butting of the coils which would damage the spring.

FIG. 16, 17 and 18 show an axially resilient gasket 240 in combination with grooves 242, 244 and 246 and wedges 248, 250, 252, respectively. As hereinabove described, the wedges 248, 250, 252 may be an integral part of the loading surface. These alternative embodiments show the wedge 248 having a leg portion 254 which can be used to modify the groove width.

Alternatively, as shown in FIG. 17, the groove 244 may have a tapered portion 256 for additionally compressing the spring 240 along the minor axis 258 thereof. Yet another embodiment is shown in FIG. 18 wherein the wedge 250 has a v-shape and cooperates with wedge 252 for biasing the spring 240.

FIGS. 19, 20 and 21 show a radially resilient gasket 270 as it may be disposed in grooves 272, 274 and 276, respectively, along with loading by wedges 278, 280, 282. The gasket 270 may be housing 290 mounted or piston 292 mounted. Further, the groove 272, 274, 276 may be disposed in a single housing or a piston, not shown, or alternatively, may be formed in conjunction with a mating member 300, 302, 304, respectively. Similar to the mounting of the axially resilient gasket 240 a wedge-shaped gasket 282 may be utilized when a bevelled edge 306 is incorporated into the mating member 304.

All of the embodiments shown in FIGS. 16-21, as well as those shown in FIGS. 22 and 23, are only diagrammatically shown and briefly discussed since the principles of operation were more thoroughly discussed in connection with the gaskets 30 and 170.

For example, FIG. 22 shows a gasket 310 disposed in a groove 312 formed by mating portions 314, 316 which are held in position for biasing by the gasket 310 and by a clip member 318. FIG. 23 shows a built-in wedge 330 for biasing the gasket 332 within a groove 334 formed by right and left-hand members 336, 338, with the gasket 332 being loaded by a flange 340.

FIG. 24 shows a specific load-deflection curve for a gasket made in accordance with the present invention having the dimensions set forth in the description of FIG. 14. In this instance, the spring is made from wire having a circular cross-section with a diameter of 0.022 inches, a coil height of about 0.16 inches, a back angle of between about 13° and about 15°, a front angle between 29° and 31°, and coil spacing of between about 0.19 inches and 0.17 inches.

Figure 25:
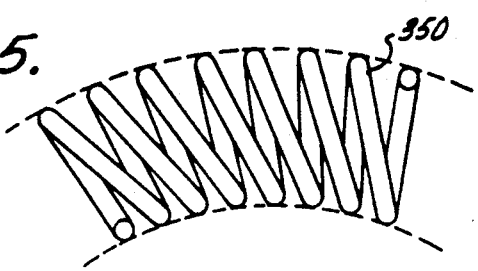
FIG. 25 is a coil spring in an unloaded or free state.
Figure 26:
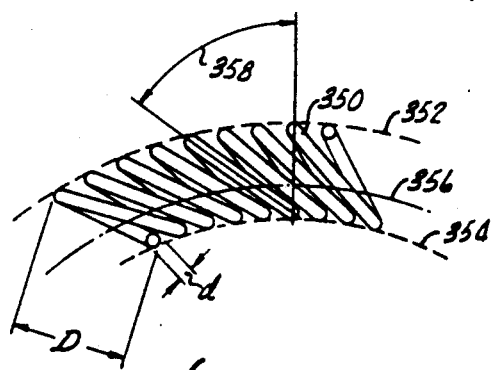
FIG. 26 shows the coil of FIG. 25 in a loaded state with spacing between the individual coils.
Figure 27:
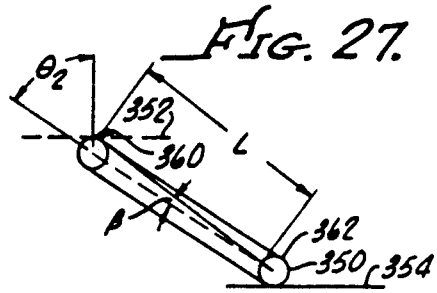
FIG. 27 is a cross-section of a single individual coil of the loaded coil of FIG. 26 showing the maximum linear dimension or operation, L, available for electromagnetic wave propagation.

FIGS. 25-26 show in diagrammatic form a plurality of coils 350 in an unloaded state and loaded between surfaces 352, 354 along with a load circle 356. A final front angle 358 along with the maximum linear dimension, or aperture, L, available for electromagnetic wave propagation. FIG. 27 is an enlarged view of one coil showing the aperture, L, extending from a point (360) of contact on load surface 352 at the O.D. of the coil 350 to the top 362 of the coil 350 bearing on the load surface 354.

Figure 28:
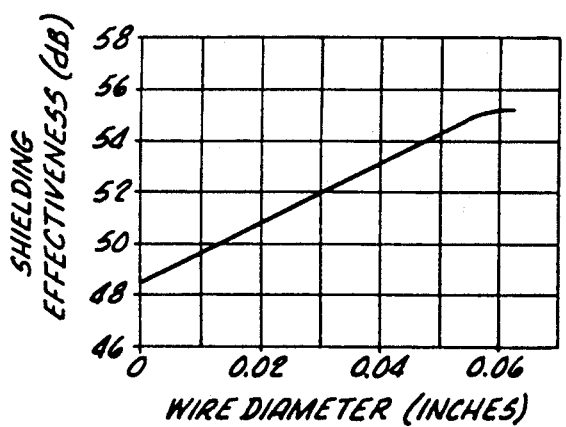
FIG. 28 shows the effect of wire diameter (d) or shield effectiveness for the coils of FIG. 26.
Figure 29:
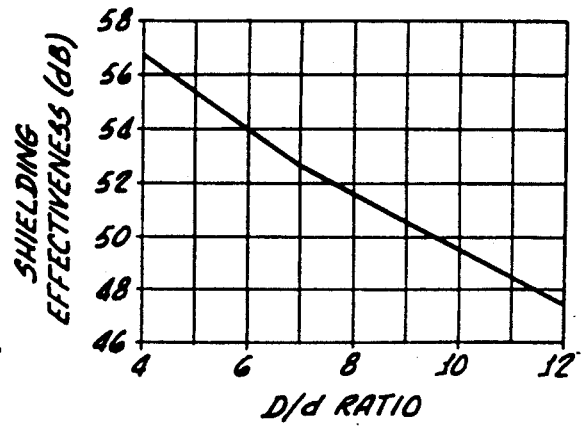
FIG. 29 shows the effect of coil diameter (D) or shield effectiveness for the coils of FIG. 26.

It can be determined that the aperture, L, can be made smaller and hence increase shield effectiveness for a given frequency by increasing coil wire diameter, d. This is shown in FIG. 28. Coil height, D, also affect the approximate size. It should be apparent that for a fixed wire diameter, d, an increase in coil height, D, decreases shield effectiveness for a given frequency. This is shown in FIG. 29. Consequently, for gaskets in accordance with the present invention in which the individual coils do not abut, the greater the wire diameter, d, and the smaller the coil 35 height, D, the greater the shield effectiveness.

Figure 30:
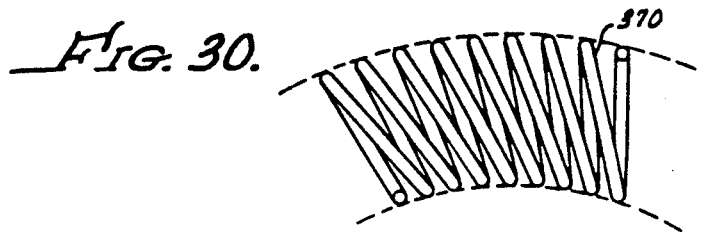
FIG. 30 is a coil spring in an unloaded or free state.
Figure 31:
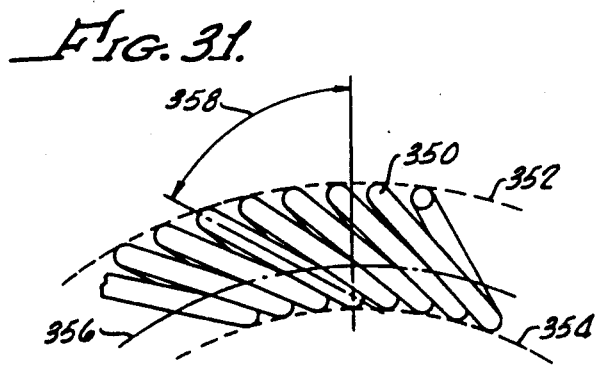
FIG. 31 shows the coil of FIG. 30 in a loaded state with the individual coils abutting one another, the wedge causing such butting now shown.
Figure 32:
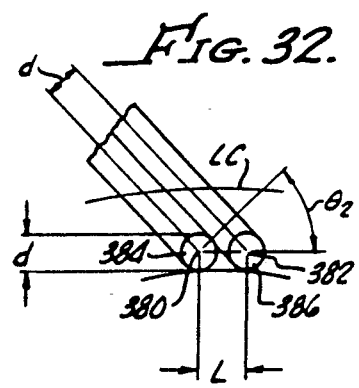
FIG. 32 is a cross-section of adjacent individual coils showing the maximum linear dimension, L, available for electromagnetic wave propagation.

The alternative embodiment of the present invention in which coils 370 abut is shown in FIG. 30, in a free state, and in FIG. 31 in a loaded state with adjacent coils 370 abutting one another between surfaces 372, 374. The load circle 376 is also shown along with the final front angle 378. FIG. 32 is an enlarged view of the maximum linear dimension, or aperture, L, available for electromagnetic propagation.

It can be easily seen that the aperture, L, for abutting coils 370 is significantly less than the aperture, L, in the case of spaced-apart coils 350 shown in FIGS. 26-27. As an example, for the same wire diameter, d, and coil diameter, D, a gasket with coils 370 abutting has up to four times the shielding effectiveness than coils 350 not abutting.

Figure 33:
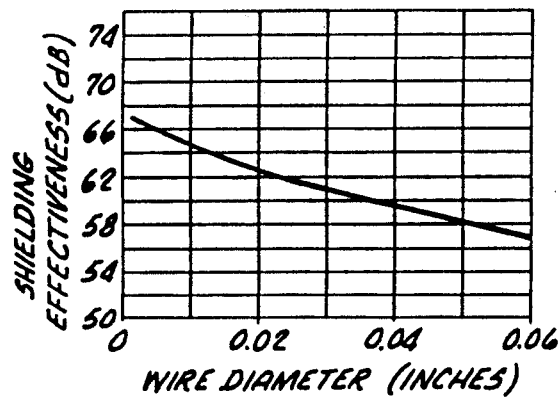
FIG. 33 shows the effect of wire diameter, d, or shield effectiveness for the coils of FIG. 31.

It is also important to note in the design of abutted coils 370 gaskets, that because the aperture, L, extends between centers 380, 382 of the individual coil wires 384, 386, the larger the wire diameter, the lower the shield effectiveness for a given frequency. (See FIG. 33.)

Figure 34:
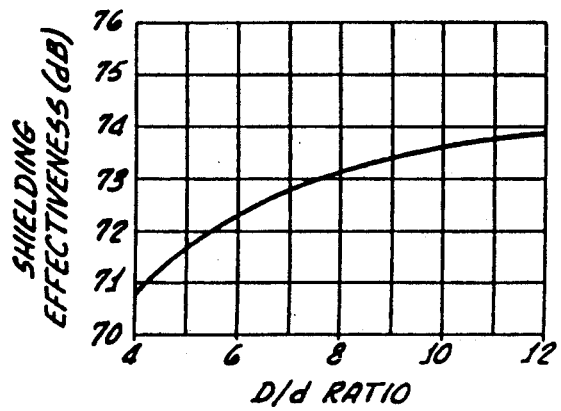
FIG. 34 shows the effect of coil diameter (D) or shield effectiveness of the coil of FIG. 31.

The reverse is also true for the coil height to wire diameter ratios D/d shown in FIG. 34.

As herein described, shielding effectiveness is affected by the aperture length, L, which is determined, in part, by whether the coils 32 (FIG. 8) are spaced apart at load (FIG. 26) or abut, (FIG. 31).

Figure 38:
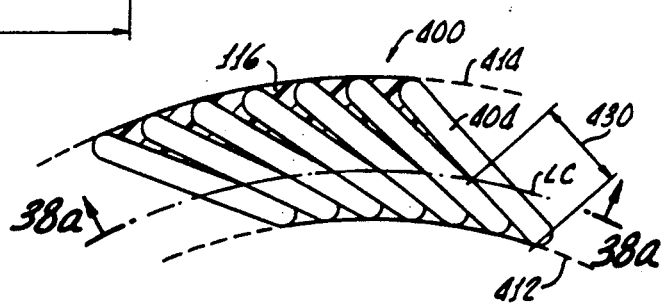
Figure 38A:
FIG. 38a is across-section of the spring gasket shown in FIG. 38 above an aperture formed by abutting coils.
Figure 39:
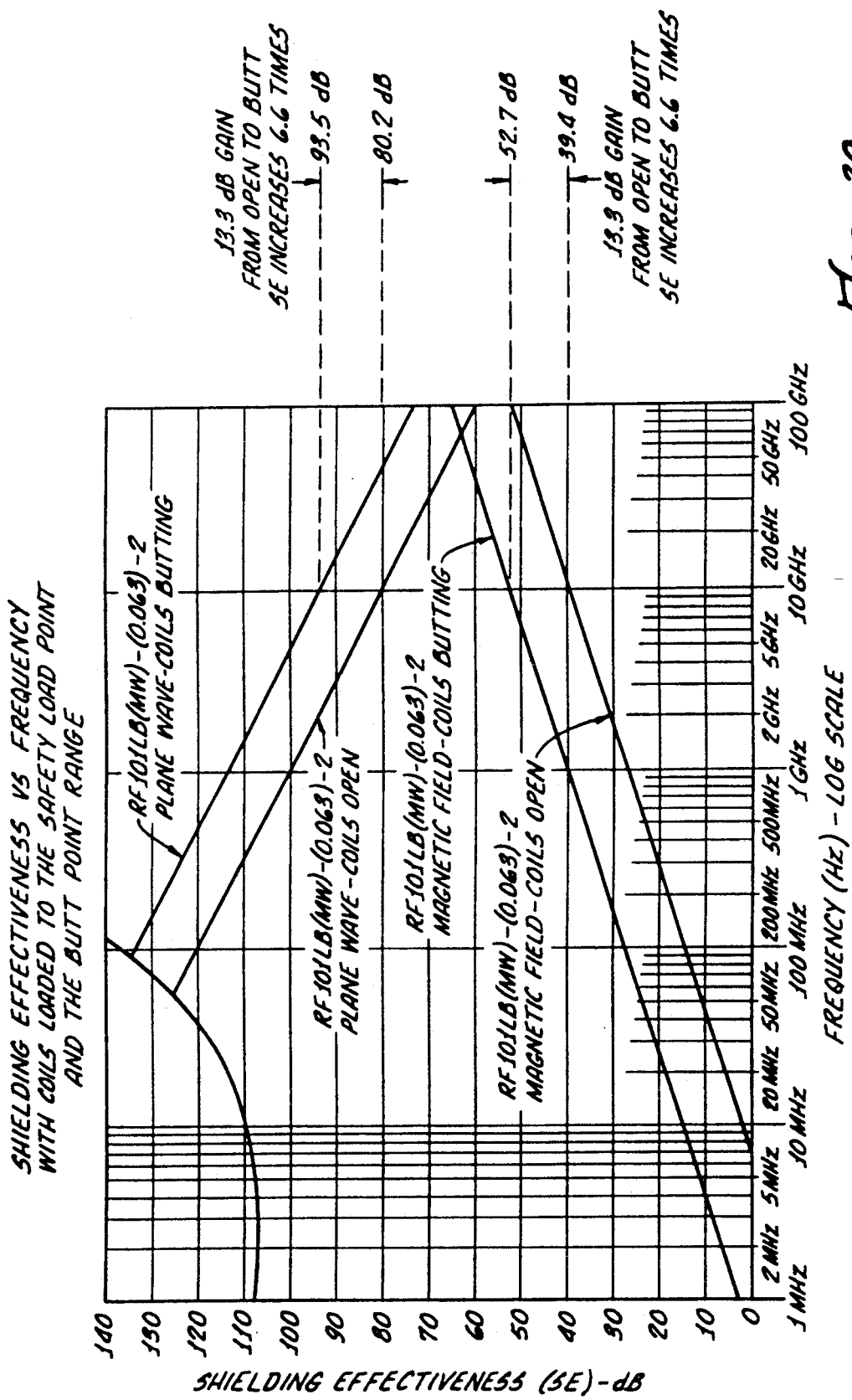
FIG. 39 is a plot of Shielding Effectiveness vs. Frequency for plane wave and magnetic fields showing the difference between abutting coils at load and non-abutting coils at load for the spring gaskets of FIGS. 35-38.

A calculated comparison of the shielding efficiency of a spring 400 having the specification set forth in Table 1 with coils not abutting (see FIGS. 35-36) and coils abutting (see FIGS. 37-38) is shown in FIG. 39.

TABLE 1

| SPRING PARAMETERS | |
| --- | --- |
| Wire Diameter | 0.003 inch |
| Coil Height | 0.025 inch |
| Coil Width | 0.023 inch |
| Back Angle | 12° |
| Spacing Between Coils | 0.0035 inch |
| Spring I.D. | 0.063 inch |
| Approx. No. of Coils | 35 |

Figure 35:
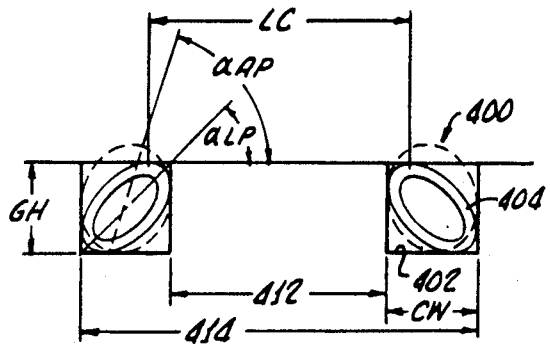
FIGS. 35 and 36 show an axial spring gasket deflected to safety load with spacing between coils at load filled with a conductive material.
Figure 36:
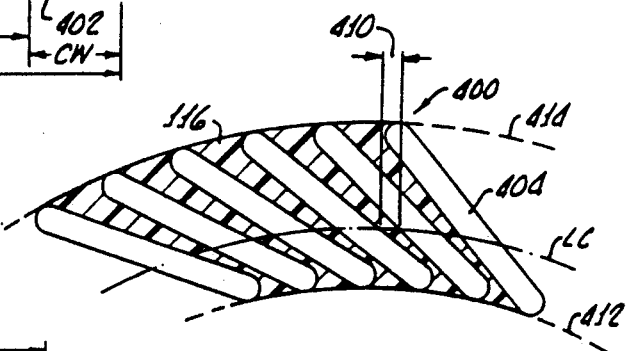

In FIG. 35, the spring 400 is shown in a groove 402 having a width CW and a height GH with the coils 404 having an assembled turn angle $\alpha_{AP}$ of about 70° and a load turn angle $\alpha_{LP}$ of about 45°, LC denotes the load circle with the spring 400 axially loaded. The spacing 410 between coils is more clearly shown in FIG. 36 along with the groove inside diameter 412, outside diameter 414 and load circle, LC.

Figure 37:
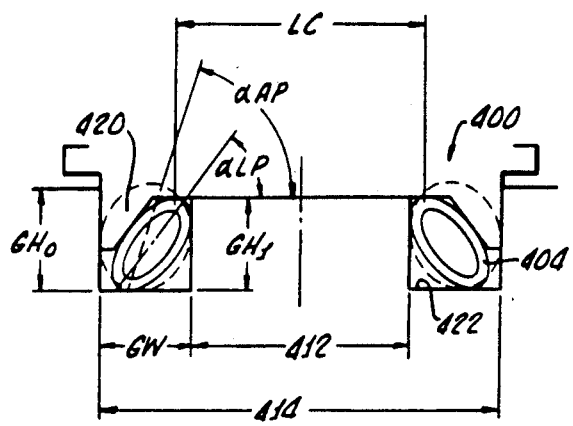
FIGS. 37 and 38 show the spring gasket of FIGS. 35 and 36 loaded with a wedge with coils butting a load circle.

FIGS. 37 and 38 show the spring 400 with the coils 404 loaded to a butting position by a wedge 420. In this case, the groove 422 has an outside height, $GW_o$, greater than an inside height, $GW_i$. The coils 404 have an assembled turn angle $\alpha_{AP}$ of about 70° and a load turn angle $\alpha_{LP}$ of about 55°. As shown in FIG. 38, the coils abut from the groove inside diameter 412 to the load circle LC as indicated also by an arrow 430.

The average aperture for coils 404 abutting and open for various groove I.D., 412 is shown in Table 2.

TABLE 2

| GROOVE I.D. (Inches) | BUTTING | | OPEN | |
|---|---|---|---|---|
| | Average Aperture (Inches) | Average Number of Coils | Average Aperture (Inches) | Average Number of Coils |
| 0.063 | 0.0056 | 35.5 | 0.0257 | 35.5 |
| 0.125 | 0.0065 | 61.0 | 0.0264 | 61.0 |
| 0.250 | 0.0071 | 111.5 | 0.0268 | 111.5 |
| 0.500 | 0.0074 | 213.0 | 0.0271 | 213.0 |

Shielding Effectiveness vs. Frequency for plane wave and magnetic field for the coils 404 abutting and not abutting as shown in FIG. 39.

As shown in FIG. 39, at a frequency of 10 gHz, with the coils 404 open at load (FIGS. 35-36), shielding effectiveness of 80.2 dB is achieved for a plane wave and for the coils (FIGS. 37-38) butting, the shielding effectiveness is 93.5 dB or 13.3 dB greater. This change, 13.3 dB corresponds to an increase in shielding effectiveness of 6.6 times greater when the coils 404 are butting at load.

For a magnetic field, the different in shielding effectiveness is also 13.3. dB and, therefore, the increase in shielding effectiveness when the coils are butting versus when the coils are open is again 6.6 times greater.

Figure 40A:
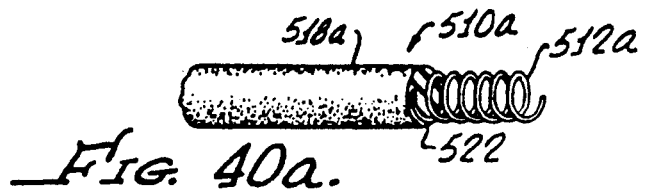
FIGS. 40a and 40b are partially cutaway perspective views of a spring assembly in accordance with the present invention generally showing a plurality of coil means disposed within an elastic material.
Figure 40B:
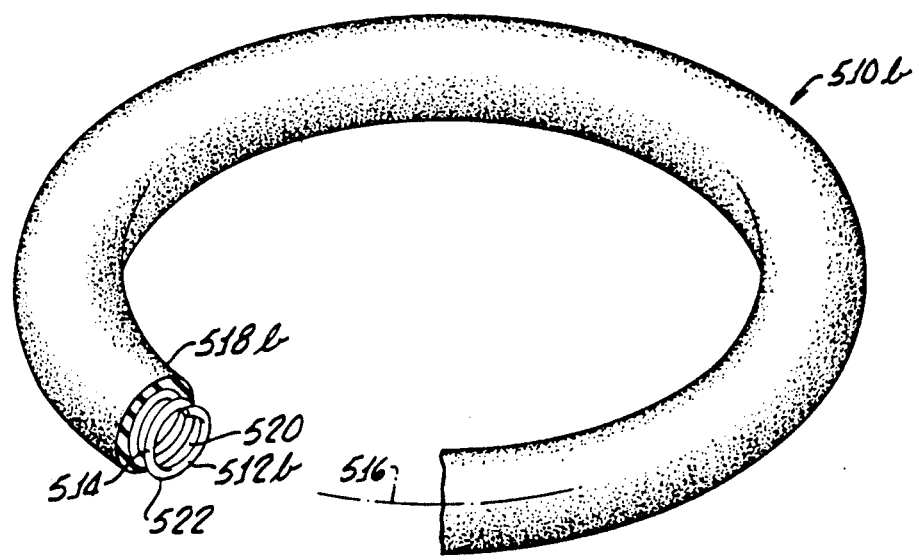
Figure 40D:
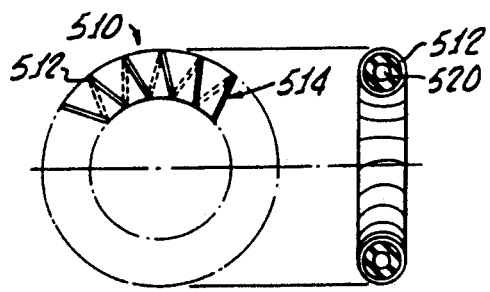
FIG. 40d is a round spring embodiment of the present invention filled with a conductive elastomer with a hollow core.
Figure 40C:
FIG. 40c is a cross-sectional view of the spring assembly shown in FIG. 40b with a fugative material therein which is later removed in accordance with the method of the present invention.
Figure 49:
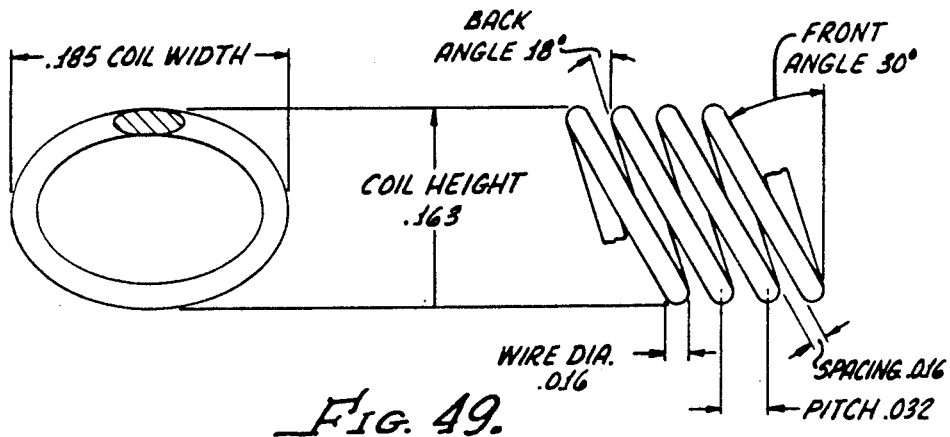
FIG. 49 is a spring, in accordance with the present invention, with a plurality of coils showing specific dimensions thereof.

Turning now to FIGS. 40a, 40b and 40c, there is shown a spring assembly 510a, 510b, in accordance with the present invention, which includes a plurality of coils 512a, 512b interconnected with one another in a spaced-apart relationship. The spring 514 may be assembled in order to exert a generally constant force in a loading direction, normal to a tangent to a center line 516, as hereinabove described.

A conductive elastic material 518, 518b, such as that hereinabove described, may be disposed around and between the plurality of coils 512 and may include a hollow cross-section 520 which provides means for modifying the force exerted by the spring assembly 514 in response to deflection of the spring assembly 510b along a loading direction as hereinafter described in greater detail. As shown in FIG. 40d, the spring assembly 514 may include circular coils, not canted to a center line thereof, or as hereinafter described, canted coil assemblies.

The spring 510a is linear and may have ends attached to form the spring assembly 510b which may be circular as shown or have any other shape which may be useful in forming a gasket-type seal around a rectangular opening, for example. The conductive elastic, or elastomer, material 518a, 518b, may be of any suitable type plastic or the like, with resiliency suitable for the overall design objectives of the spring assembly 40a, 40b.

Before application of the elastomer 518a, 518b, to the coils 512a, 512b, a coating 522 may be applied to the coils 512a, 512b, in corder to control the bonding of the elastomer 518a, 518b thereto, as hereinabove noted. With proper selection of the coating, which may be any conventional silicon release material or the like, depending on the elastomer, complete nonbonding of the elastomer or partial bonding of the elastomer 518a, 518b, to the coils 512a, 512b may be achieved. However, any method for controlling the bonding of an elastomer to a metal, as may be well-known in the art, may be utilized. For example, many elastomers, such as Silastic 732 RTV adhesive sealant from Dow Corning of Midland, Mich., requiring a metal surface to be primed with a suitable material to obtain adherence thereto. Consequently, if the coils 512 are not primed, or partially primed, some bonding or partial bonding will occur.

While the spring assembly 510 shown in FIG. 40b has a generally circular shape, it should be appreciated that any irregular shape such as the spring assembly 650 shown in FIG. 41 as long as the cross-section thereof is hollow in cross-section. Alternatively, the spring 512 may not be joined, for example, as shown in FIG. 40a. In this instance, the length of elastomer-coated, or filled, coils may be used in applications suitable for linear springs.

The spring 514 may be filled by any manufacturing method suitable for the elastomer employed, such methods including extrusion, molding, spraying or any other suitable method for introducing elastomer 518 in and around the coils 512 of the spring 514, while leaving a hollow cross-section 520 along the center line 516. Such other methods may include the fusing of two tubular parts (not shown), one disposed on the inside of the spring 514 and one disposed on the outside of the spring 514 with the fusing of the parts filling of the spaces between the coils 512.

Alternatively, the conductive elastomer 518 may be formed in and around the coils 512 while a rod 651 of fugative compound may be disposed within the coils 512 (see FIG. 40c). Thereafter, the fugative compound may be dissipated or removed by heat or solution, as is well-known in the art.

Various embodiments of the present invention are shown in FIGS. 42 through 48b. In FIG. 42, coils 652 with an interior elastomer 654 are shown with the coils 652 having an elliptical shape and the elastomer 654 having a circular shaped void 656 therethrough. FIG. 43 shows elliptically shaped coils 656 having an elastomer 658 with an offset, or generally rectangular, hollowed cross-sectional opening 660 therethrough, while FIG. 44 shows an elliptically shaped coil 662 having an elastomer 664 with an irregularly shaped opening 666 comprising to generally circular cross-sectional areas 668, 668'.

As hereinbefore mentioned, the elastic material may be disposed within the coils 652, 656, 662 as shown in FIGS. 42, 43 and 44 or, alternatively, as shown in FIG. 45, an elastomer 668A may be disposed on one side 670A of coils 672A. This embodiment is most useful in applications in which a greater distribution of the load is desirable on the one side 670A of the coils 672A.

Other embodiments 670, 672, 674, 674a, 674b of the present invention, shown respectively in FIGS. 46 through 48b, said embodiments 671, 672, 674, 674a, 674b including coils 678, 680, 682, 682a, 682b and elastomers 686, 688, 690, 690a, 690b. The embodiment 670 includes an open area 690 through the coils 678 in order to facilitate the passage of fluid (not shown) for pressure variation, cooling or lubrication purposes. FIGS. 48a, 48b show the elastomer 690a, 690b as solid within the coils 682a, 682b and in FIG. 48a a portion of elastomer 690'a extends outside the coil 682a.

As can be seen from FIG. 47, the elastomer 688 may be disposed as a coating both the inside 694 and outside 696 of the coil 680, while FIG. 48 shows the elastomer 690 disposed along the outside and through the coils 682. All of these embodiments differently affect the force-deflection characteristics of the embodiments 671, 672, 674 depending upon the application of the embodiments 671, 672, 674.

The ability to maintain a relatively constant force within a certain deflection is affected by a number of parameters, all of which are taken into consideration, which include the cross-section of the elastomer and the disposition thereon as indicated in FIGS. 42 through 48b, the thickness of the elastomer, the flexibility of the elastomer, the degree of bonding between the springs 652, 654, 670, 686, 688, 690 and corresponding elastomers 654, 656, 668, 686, 688, 690, the spacing between the coils 652, 654, 670, 678, 680, 682, the wire diameter, coil height and coil width, among other considerations.

It is to be appreciated that when a canted-coil spring is filled with an elastomer, especially in an outer portion of the coil, the force applied thereon is transmitted more uniformly and the stress acting on the mating parts is substantially lower. In applications where the canted-coil spring assembly 510 is used in connection with the sealing device, it provides substantially better sealing ability and results in a substantial increase in the seal performance and seal life.

The ability of the hollowed canted-coil spring filled with an elastomer having a hollow center to achieve a high degree of deflection and maintain a relatively constant load within a high deflection decreases the total amount of force that is needed to affect sealing and this offers a significant advantage, especially in dynamic situations. The ability of the hollowed elastomer-filled spring to stretch facilitates its assembly in a single groove construction, similar to that as can be found in O-ring applications for both mounting the assembly 510 in a piston (not shown) or in a housing (not shown).

Another very important feature of the elastomer-filled spring 514 with hollow cross-section 520 is its use as a seal itself. Heretofore, elastomers have used the canted-coil spring as a loading means in order to maintain intimate contact between the sealing surfaces of the elastomer. In many prior art applications, the elastomer tends to age or relax due to gaining stiffness of the elastomer, or due to temperature cycling, and the spring is used to force the elastomer in contact with the sealing surfaces. In the present invention, by combining the elastomer 518 within the spring 514 and providing a hollow cross-section 520, both items can be accomplished in one, with a higher degree of reliability and sealing ability, and this can be done in reciprocating, rotating, oscillating, and static applications.

Another important feature is to use the spring assembly 510 as a loading means to provide more uniform loading on a sealing surface (not shown) which results in substantially better performance because it enables the use of a smaller wire, thus uniformly distributing the load which results in more effective sealing ability and longer seal life.

In all these applications, the elastomer 518 may be any type of elastomeric material of formable composition, such as silicone, Buna N, nitrile, fluorosilicones, PTFE, elastomers, etc. Also certain types of plastics that have the properties of elastomers can be used due to their high coefficient of friction, their operating temperature, etc. Conductive filters for the elastomer 518 have been hereinbefore described and include both metallic and non-metallic materials.

Figures 50A, 50B, 50C:
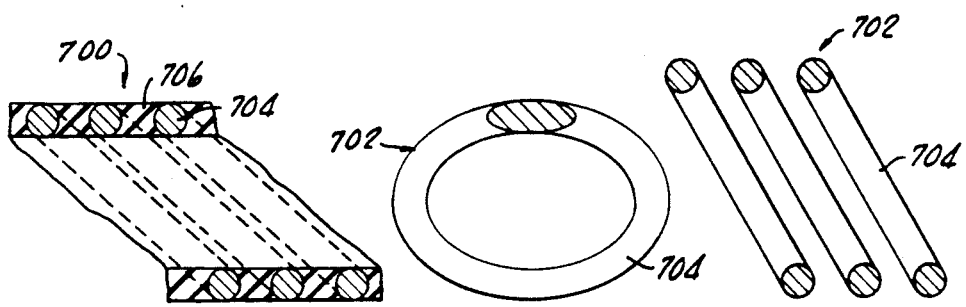
FIGS. 50a-c show in cross-sectional manner a spring disposed within an elastomer in a preloaded condition.

Turning now to FIG. 50a, there is shown as spring assembly 700 in accordance with the present invention in which the spring 702, shown also in FIGS. 50b and c, includes plurality of coils 704 which are preloaded before being imbedded in an elastomer 706. This further enables the tailoring of the force-deflection curve of the spring assembly 700.

Figures 51A, 51B, 51C:
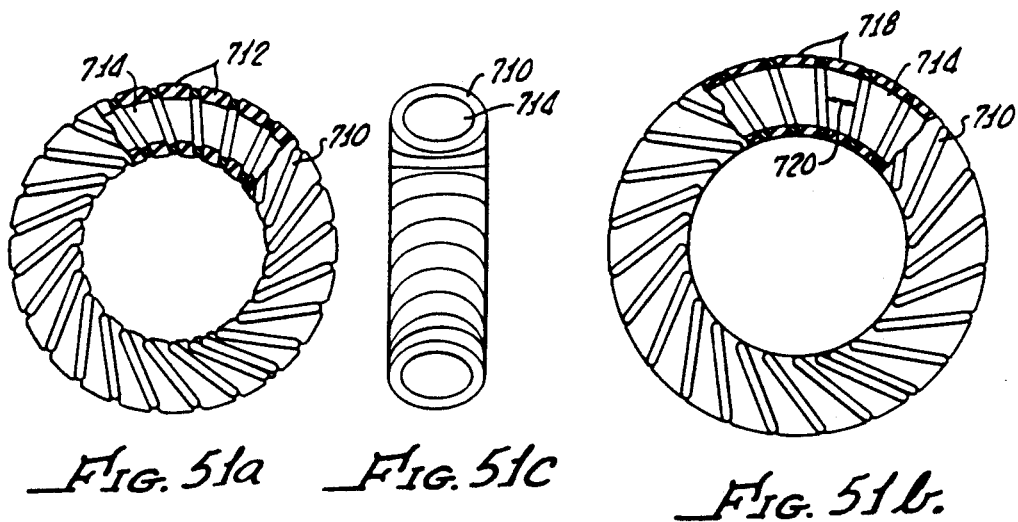
FIGS. 51a-c show a spring in a free position and imbedded in an elastomer in a stretched configuration.

FIG. 51a shows a radial spring 710 filled with an elastomer material 712 having a hollow center 714.

In this case, the spring is in a free position when filled with material. It should be contrasted with the FIG. 51b in which the spring 710 is stretched, with greater spaces as indicated by the arrow 720 between the coils 710 when filled with the elastomer material 718, the latter having a hollow core 714 as shown in FIG. 51c. The force developed by the spring 710 depends on the amount of the elastomer, degree of bonding, spacing between the coils, s ratio of the coil height to coil width, etc. A spring of this type may be used in order to provide an extension load or can be used to provide a combination of extension load and compression load. In either case, stretching of the coils can be used to further modify the force-deflection curve of the spring 710.

In the manufacture of the spring assembly 510, the spring 514 may be made longer than necessary to complete a circle within a groove 750 as shown in FIG. 52, the groove 750 as shown in FIG. 52, the groove 750 being in a piston or housing, not shown. In this instance, the excessive spring length will cause the elastomer 518 to butt and therefore eliminate any gap between the spring ends.

Turning to FIG. 53a and b, there is an alternate embodiment of the spring assembly 800 which includes a first plurality of coils 802 interconnected with another in a spaced-apart relationship for causing the spring assembly 800 to exert a generally constant force in a loading direction normal to a tangent to a center line 804. As hereinbefore described in connection with the plurality of coils 512, an elastic material 806 is disposed around and between the plurality of coils 802 a hollow cross-section 808 which provides means for modifying the force exerted by the spring 802 assembly 800 in response to deflection of the spring assembly 800 along a loading direction as hereinbefore described.

Disposed within the plurality of coils 802 is a second plurality of coils 810 interconnected with one another in a spaced-apart relationship and disposed in a cooperating relationship inside the first plurality of coils for causing the spring assembly 800 to exert a generally constant force in a loading direction approximately normal to the center line 804.

An elastic material 812 is disposed around and between the plurality of coils 810 and includes a hollow cross-section 814. FIG. 53b shows a cross-sectional view of the spring assembly 800 and also shows that the elastic materials 806, 812 may be separate from one another with a gap 820 therebetween to allow relative movement therebetween as the spring assembly 800 is loaded.

Similar to the spring assembly 800, a spring assembly 830 shown in FIGS. 54a and b includes a first plurality of coils 832 with an elastic material 834 disposed therearound and a second plurality of coils 836 within the elastic material 838 therearound. The configuration of the first and second plurality of coils 832, 836 and elastic material 834, 838 is similar to the coil assembly 800 shown in FIGS. 53a and b except that the first plurality of coils 832 is canted in an opposite direction from the second plurality of coils 836 along a center line 842. The performance of the embodiments shown in FIGS. 53a and b and 54a and b are similar to that hereinbefore described in connection with the spring assembly 510 further extending the design range capability of the forced deflection curves thereof.

Turning now to FIGS. 55-57, there is shown alternative embodiments 850, 852 of the present invention which include a plurality of coils 854, 856 within the elastic material 858, 860 thereabout. The feature of the embodiments of 850, 852 is the shape of the elastic 858, 860 which includes depending portions 864, 866 and 868, respectively, which provide a means for positioning the plurality of coils 854, 856 in order that the loading direction is approximately perpendicular to the center line 870, 872, respectively. Although not shown in FIG. 56, the elastomer 358 may be disposed between the coils 854 as hereinabove shown in FIGS. 58a, 58b, 58c and 58d.

Figure 58A:
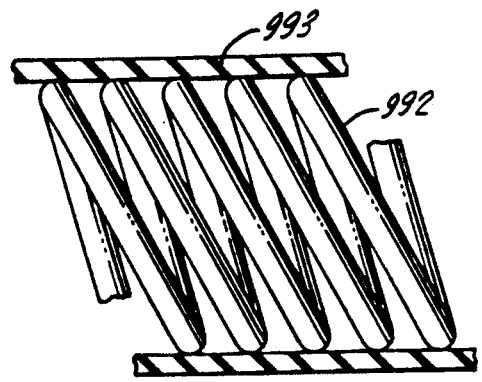
FIGS. 58a-c are cross sections views of a spring and elastomer showing reletive positons of the elastomer with respect to coils of the spring.
Figure 58B:
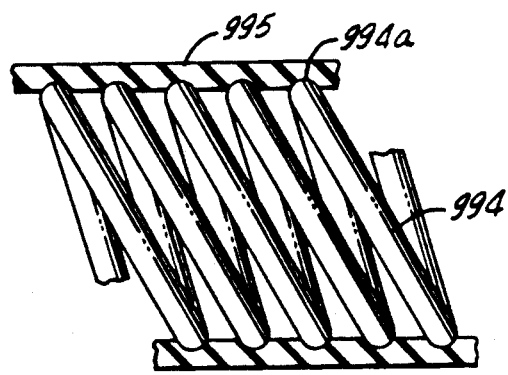
Figure 58C:
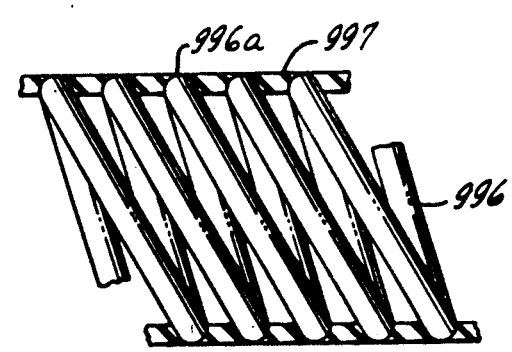
Figure 58D:
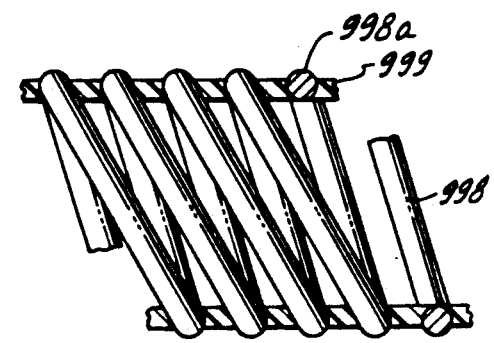

Various positions of the elastomer, or plastic, relative to the cols is illustrated in FIGS. 58a-d showing coils 992, 994, 996, 998 and respectively, elastomers 993, 995, 997, 999. As shown in FIG. 58a, the elastomer 993 is in the form of a tube in which the coils 992 are inserted. In the embodiment shown in FIG. 58b the elastomer 995 is partially disposed between the coils 994 past an outside circumference 994a thereof while in the embodiment shown in FIG. 58c the elastomer 997 is flush with an outside circumference 996a of the coils 996. FIG. 58d shows the elastomer 999 between the coils 998 past an outside circumference 998a thereof which enables a higher degree of conductivity and at the same time, provide environmental low pressure sealing. This takes place because under load the spring coils 998 will touch mating parts and the elastomer 999 will flow around the loading coils and provide an environmental-low pressure seal (up to 5 psi).

Although there has been described hereinabove a specific arrangement of an electromagnetic shielding gasket assembly in accordance with the present invention, for the purposes of illustrating the manner in which the invention may be used to advantage, it should be appreciated that the invention is not limited thereto. Accordingly, any and all modifications, variations, or equivalent arrangements which may occur to those skilled in the art should be considered to be within the scope of the invention a defined in the appended claims.

What is claimed is:

1. Electromagnetic shielding gasket assembly comprising:
   coil spring means for blocking the propagation of electromagnetic waves therepast, said coil spring means comprising a plurality of individual coils canted along a center line thereof;
   means for supporting the plurality of coils in an orientation for controlling the electromagnetic shielding effectiveness of the coil spring means; and
   formable conductive means, disposed on said plurality of individual coils, for filling an aperture of the coil spring means to further block the propagation of electromagnetic waves upon loading of the plurality of individual coils.

2. The electromagnetic shielding gasket assembly according to claim 1 wherein sufficient formable conductive means is present to provide a low pressure seal.

3. The electromagnetic shielding gasket assembly according to claim 1 wherein said individual coils are interconnected in a manner forming a continuous circular coil spring.

4. The electromagnetic shielding spring gasket assembly according to claim 1 wherein said formable conductive means comprises a nonconductive elastomer with conductive material therein.

5. The electromagnetic shielding spring gasket assembly according to claim 1 wherein said formable conductive means comprises a soft metal.

6. The electromagnetic shielding spring gasket assembly according to claim 1 wherein said formable conductive means comprises tin.

7. The electromagnetic shielding gasket assembly according to claim 3 wherein said individual coils are fabricated from wire having a diameter, d, selected to achieve a desired shielding effectiveness, said shielding effectiveness increasing with increasing wire diameter.

8. The electromagnetic shielding gasket assembly according to claim 7 wherein said individual coils are formed with a coil height, D, selected to achieve a desired shielding effectiveness, said shielding effectiveness decreasing with increasing D/d ratio.

9. The electromagnetic shielding gasket assembly according to claim 1 wherein said individual coils are interconnected in a manner forming a continuous circular coil spring having a turn angle greater than zero degrees (0°) and said means for supporting the plurality of individual coils includes groove means for increasing the turn angle of the continuous circular coil spring to control the aperture of the circular coil spring through which electromagnetic waves may propagate, thereby controlling the electromagnetic shielding effectiveness of the coil spring means.

10. The electromagnetic shielding gasket according to claim 9 wherein said individual coils are fabricated from wire having a diameter, d, selected to achieve a desired shielding effectiveness, said shielding effectiveness increasing with increasing wire diameter.

11. The electromagnetic shielding gasket according to claim 9 wherein said individual coils are formed with a coil height, D, selected to achieve a desired shielding effectiveness, said shielding effectiveness decreasing with increasing D/d ratio.

12. The electromagnetic shielding gasket according to claim 1 further comprising groove means for containing said coil spring means, and said means for supporting the plurality of coils includes means for causing said individual coils to abut one another.

13. The electromagnetic shielding gasket assembly according to claim 12 wherein said individual coils are interconnected in a manner forming a continuous circular coil spring.

14. The electromagnetic shielding gasket assembly according to claim 13 wherein said individual coils are fabricated from wire having a diameter, d, selected to achieve a desired shielding effectiveness, said shielding effectiveness decreasing with increasing wire diameter.

15. The electromagnetic shielding gasket according to claim 14 wherein said individual coils are formed with a coil height, D, selected to achieve a desired shielding effectiveness, said shielding effectiveness increasing with increasing D/d ratio.

16. The electromagnetic shielding gasket assembly according to claim 13 wherein said means for causing said individual coils to abut comprises a wedge.

17. The electromagnetic shielding gasket assembly according to claim 16 wherein said wedge is an integral part of said groove means.

18. The electromagnetic shielding gasket assembly according to claim 16 wherein said wedge is disposed within said groove means and is not fixed thereto.

19. Electromagnetic shielding gasket assembly comprising:
  coil spring means for blocking the propagation of electromagnetic waves therepast, said coil spring means comprising a plurality of individual coils canted along a center line thereof;
  means for supporting the plurality of individual coils in an orientation for controlling the electromagnetic shielding effectiveness of the coil spring means;
  means, cooperating with said last mentioned means, for loading the plurality of coils to control an aperture of the coil spring means through which electromagnetic waves can propagate; and
  formable conductive means, disposed on said plurality of individual coils, for filling an aperture of the coil spring means to further block the propagation of electromagnetic waves upon loading of the plurality of individual coils.

20. The electromagnetic shielding gasket assembly according to claim 19 wherein said formable conductive means comprises a nonconductive elastomer with conductive material therein.

21. The electromagnetic shielding gasket assembly according to claim 19 wherein said formable conductive means comprises a soft metal.

22. The electromagnetic shield gasket assembly according to claim 19 wherein said formable conductive means comprises tin.

23. The electromagnetic shielding gasket assembly according to claim 19 wherein sufficient formable conductive means is present to provide a low pressure seal.

24. The electromagnetic shielding gasket assembly according to claim 23 wherein the formable conductive means is disposed between the plurality of individual coils and has an outside diameter less than an outside diameter of the plurality of individual coils.

25. Electromagnetic shielding gasket assembly comprising:
  coil spring means for blocking the propagation of electromagnetic waves therepast, said coil spring means comprising a plurality of coils canted along a center line thereof;
  means for supporting the plurality of coils in an orientation for controlling the electromagnetic shielding effectiveness of the coil spring means; and
  formable conductive elastic means, disposed around and between said plurality of individual coils and partially adhering thereto, for modifying a force exerted by the coil spring means in response to deflection thereof, said formable conductive elastic means being formed by said plurality of coils upon loading thereof, the formable conductive elastic means filling an aperture of the coil spring means to further block the propagation of electromagnetic waves.

26. Electromagnetic shielding gasket assembly comprising:
  coil spring means for blocking the propagation of electromagnetic waves therepast, said coil spring means comprising a plurality of coils canted along a center line thereof;
  means for supporting the plurality of coils in an orientation for controlling the electromagnetic shielding effectiveness of the coil spring means; and
  formable conductive elastic means, disposed around and between said plurality of individual coils, but not adhering thereto, for modifying a force exerted by the coil spring means in response to deflection thereof, said formable conductive elastic means being formed by said plurality of coils upon loading thereof, the formable conductive elastic means filling an aperture of the coil spring means to further block the propagation of electromagnetic waves.

27. The electromagnetic shielding gasket assembly according to claim 26 wherein sufficient formable conductive means is present to provide a low pressure seal.

28. The electromagnetic shielding gasket assembly according to claim 27 wherein the formable conductive means is disposed between the plurality of individual coils and has an outside diameter less than an outside diameter of the plurality of individual coils.

29. The spring assembly according to claim 25 or 26 wherein the coil spring means has an oval perimeter and said elastic means includes means for defining a circular hollow center portion thereof.

30. The spring assembly according to claim 25 or 26 wherein the coil spring means has an oval perimeter and said elastic means includes means for defining a plurality of hollow areas within the elastic material and inside of said plurality of coil means.

31. The spring assembly according to claim 25 or 26 wherein the coil spring means has an oval perimeter and said elastic means includes means for defining a generally rectilinear hollow center portion thereof.

32. The electromagnetic shielding gasket assembly according to claim 25 or 26 wherein said formable conductive means comprises a nonconductive elastomer with conductive fibers therein.

33. The electromagnetic shielding gasket assembly according to claim 25 or 26 wherein said formable conductive means comprises a soft metal.

* * * * *